(12) United States Patent
Ichige et al.

(10) Patent No.: US 7,563,664 B2
(45) Date of Patent: Jul. 21, 2009

(54) SEMICONDUCTOR MEMORY DEVICE EQUIPPED WITH MEMORY TRANSISTOR AND PERIPHERAL TRANSISTOR AND METHOD OF MANUFACTURING THE SAME

(75) Inventors: Masayuki Ichige, Yokohama (JP); Kikuko Sugimae, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 11/434,059

(22) Filed: May 16, 2006

(65) Prior Publication Data

US 2006/0202275 A1 Sep. 14, 2006

Related U.S. Application Data

(62) Division of application No. 10/891,133, filed on Jul. 15, 2004, now Pat. No. 7,067,872, which is a division of application No. 10/214,582, filed on Aug. 9, 2002, now abandoned.

(30) Foreign Application Priority Data

Aug. 10, 2001 (JP) ............................. 2001-244557
Aug. 10, 2001 (JP) ............................. 2001-244558

(51) Int. Cl.
*H01L 21/8329* (2006.01)
(52) U.S. Cl. .............................. 438/201; 257/E21.686; 438/257; 438/266
(58) Field of Classification Search ................. 438/201, 438/257, 258, 266; 257/E21.686
See application file for complete search history.

(56) References Cited

U.S. PATENT DOCUMENTS 5,861,650 A * 1/1999 Maeda et al. ............... 257/315
6,037,625 A 3/2000 Matsubara et al.
6,243,295 B1 6/2001 Satoh
6,255,171 B1 * 7/2001 Noble ........................ 438/266
6,417,051 B1 7/2002 Takebuchi
6,420,754 B2 7/2002 Takahashi et al.
6,624,019 B2 9/2003 Kim
6,720,612 B2 4/2004 Takeuchi et al.
6,794,708 B2 9/2004 Mori (Continued)

FOREIGN PATENT DOCUMENTS

JP 11-74371 3/1999

(Continued)

*Primary Examiner*—Allan R. Wilson
(74) *Attorney, Agent, or Firm*—Oblon, Spivak, McClelland, Maier & Neustadt, P.C.

(57) ABSTRACT

A semiconductor memory device provided with a memory cell region having first gate electrodes and a peripheral circuit region having second gate electrodes includes first gate electrodes arranged a first distance apart from each other on a semiconductor substrate, second gate electrodes arranged a second distance, which is larger than the first distance, apart from each other on the semiconductor substrate, first diffusion layers formed in the semiconductor substrate, the first diffusion layers sandwiching the first gate electrodes, second diffusion layers formed in the semiconductor substrate, the second diffusion layers sandwiching the second gate electrodes, a first insulating film formed on the first diffusion layer, second insulating films formed on the side surfaces of the second gate electrodes, first silicide films formed on the first gate electrodes, second silicide films formed on the second gate electrodes, and third silicide films formed on the second diffusion layers.

8 Claims, 40 Drawing Sheets

U.S. PATENT DOCUMENTS

| | | |
|---|---|---|
| 6,835,978 B2 | 12/2004 | Matsui et al. |
| 7,078,763 B2 | 7/2006 | Arai et al. |
| 2002/0149050 A1 | 10/2002 | Fazio et al. |

FOREIGN PATENT DOCUMENTS

| | | |
|---|---|---|
| JP | 2001-102545 | 4/2001 |
| KR | 2001-0039946 | 5/2001 |

* cited by examiner

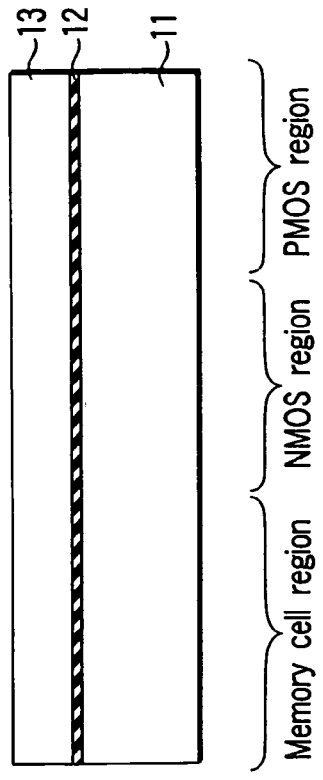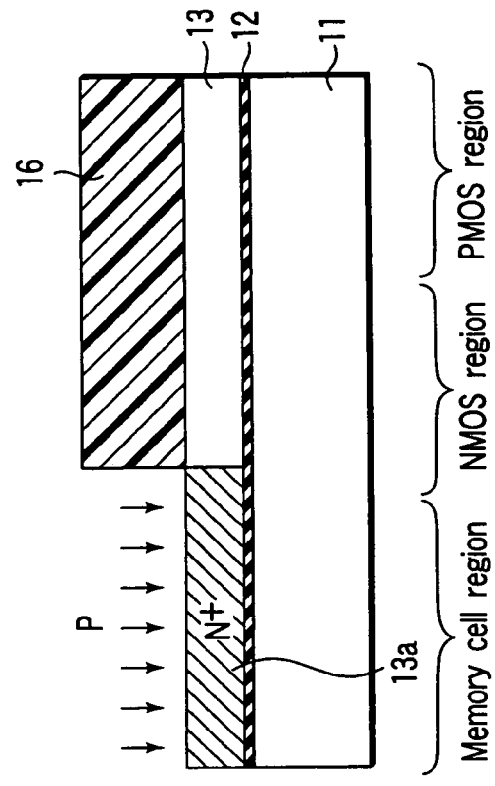
F I G. 4A  F I G. 4B  F I G. 5A  F I G. 5B

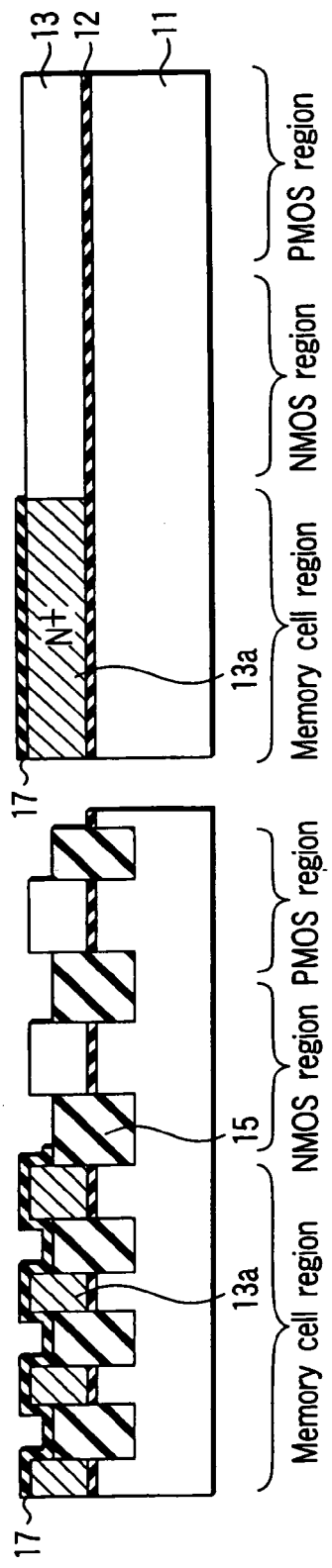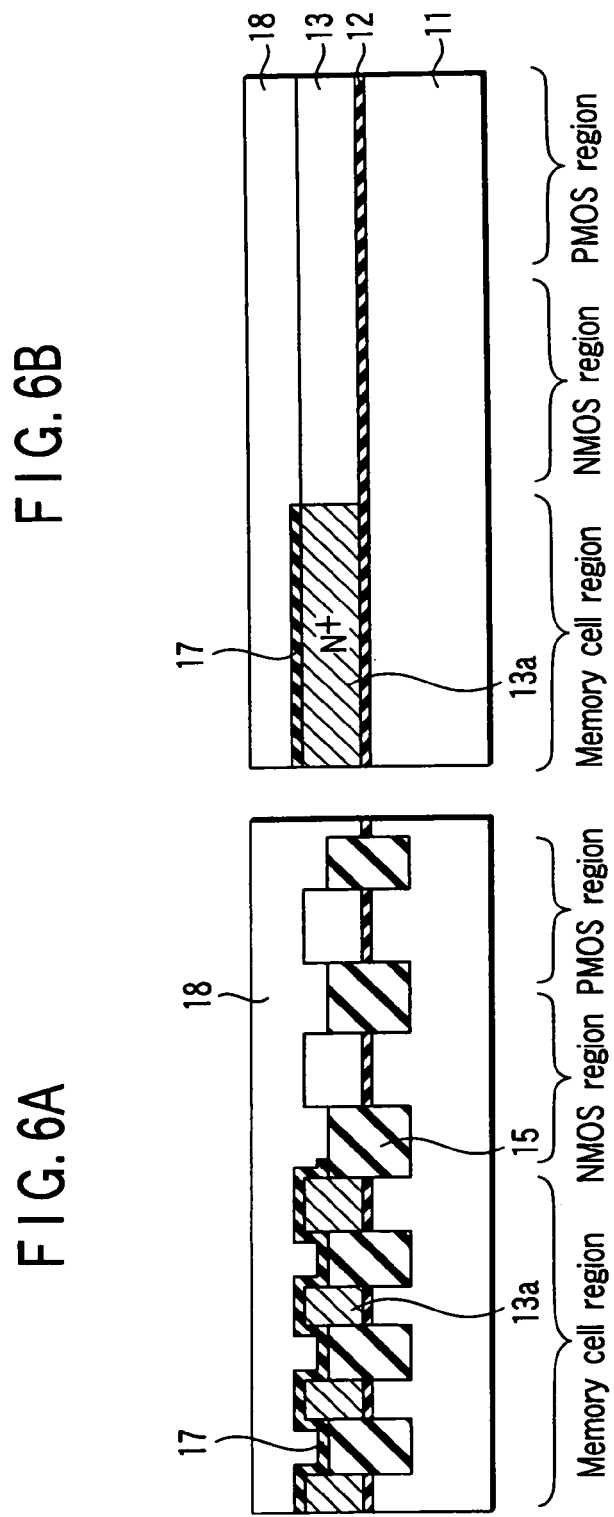

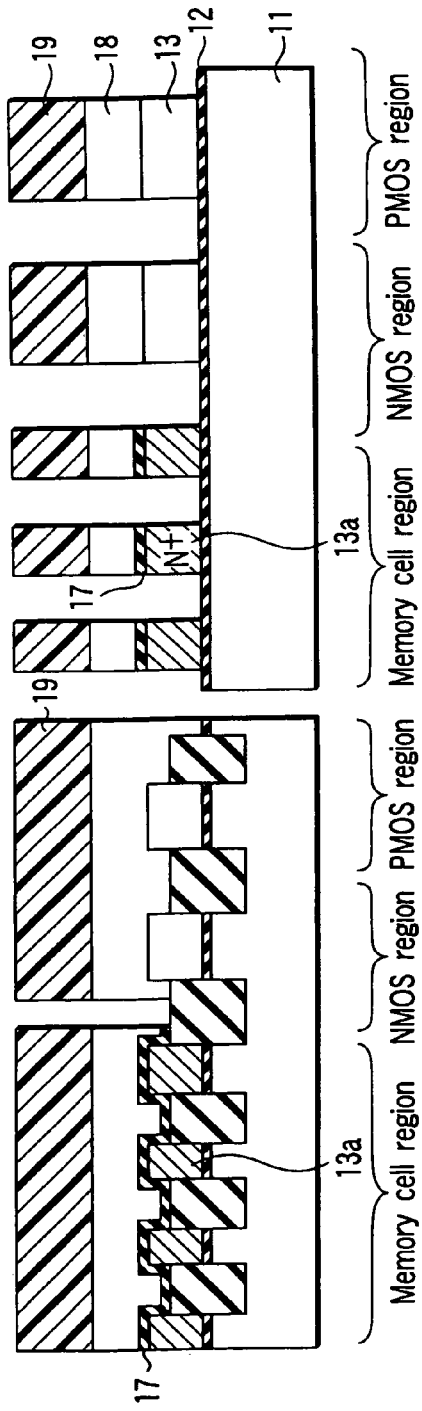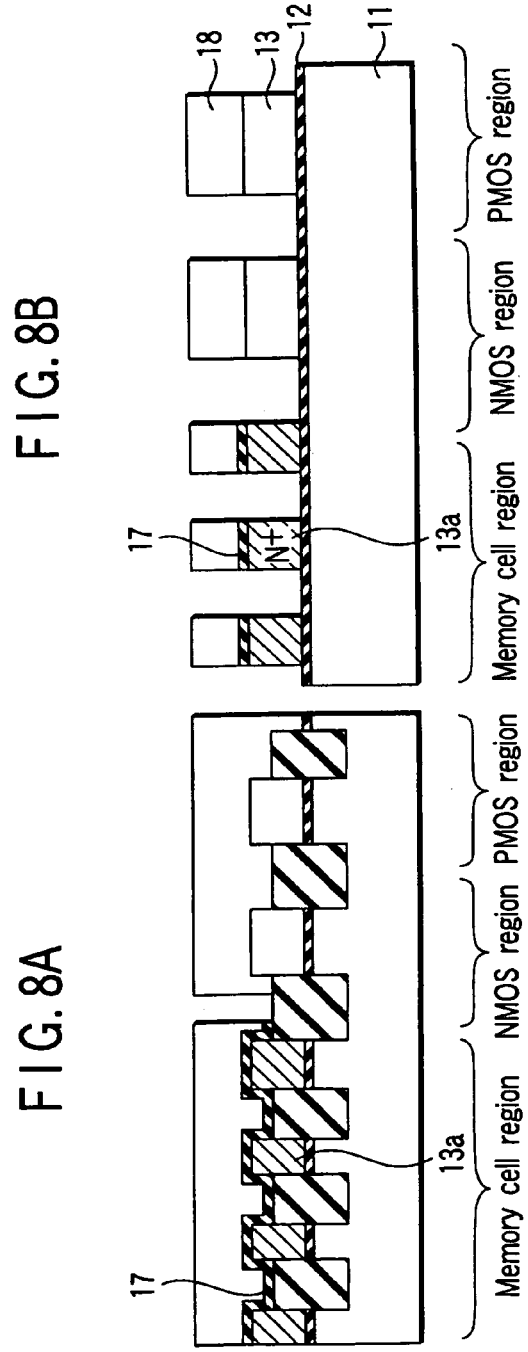

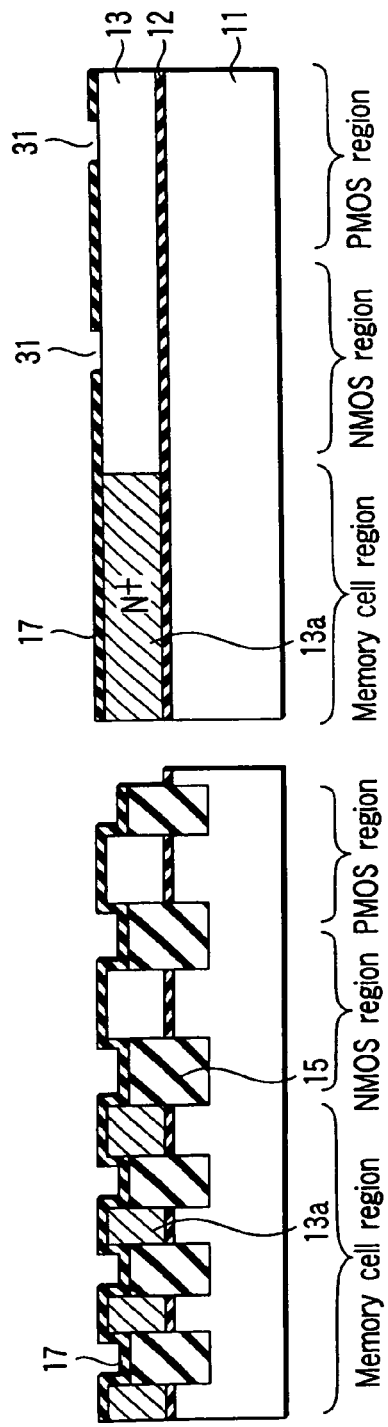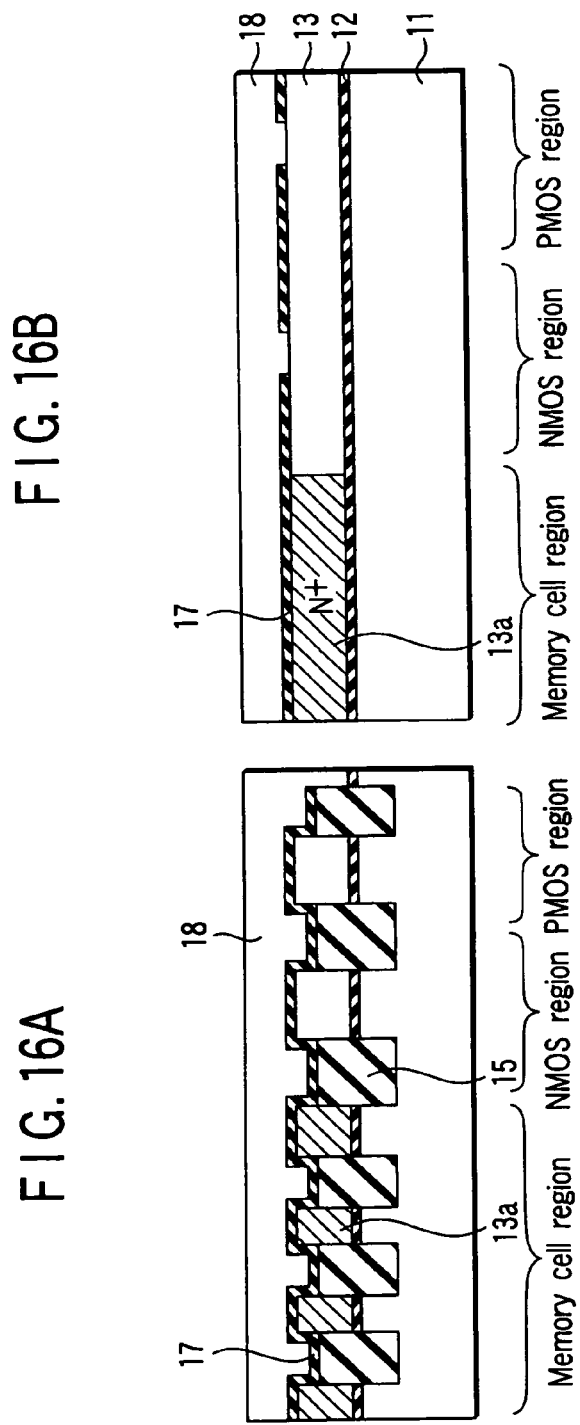
FIG. 16A  FIG. 16B
FIG. 17A  FIG. 17B

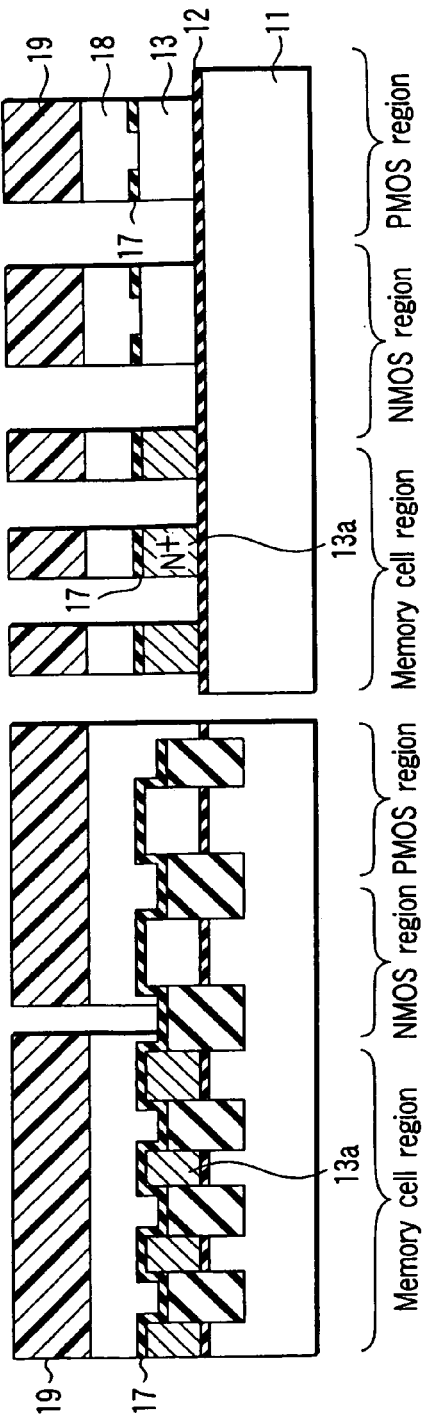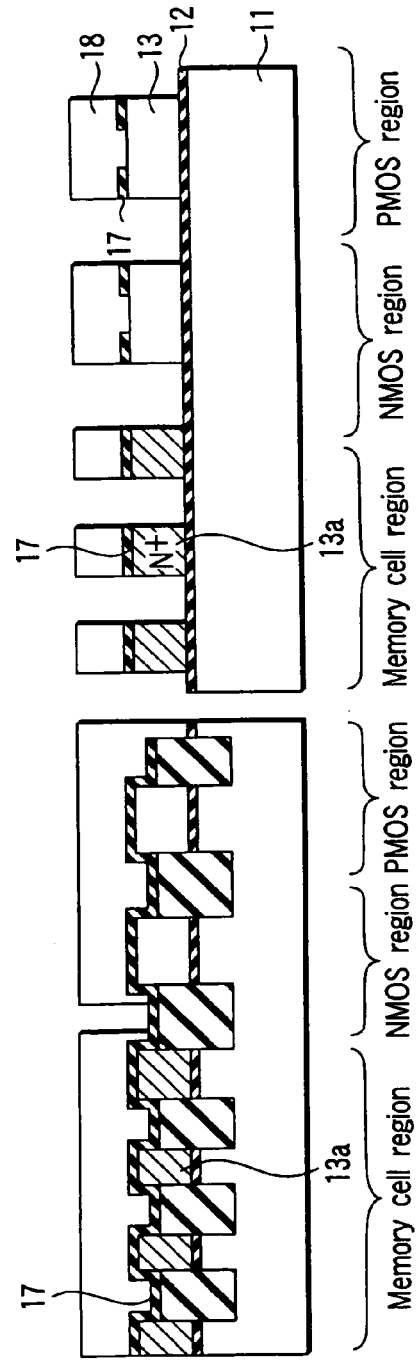
FIG. 18A
FIG. 18B
FIG. 19A
FIG. 19B

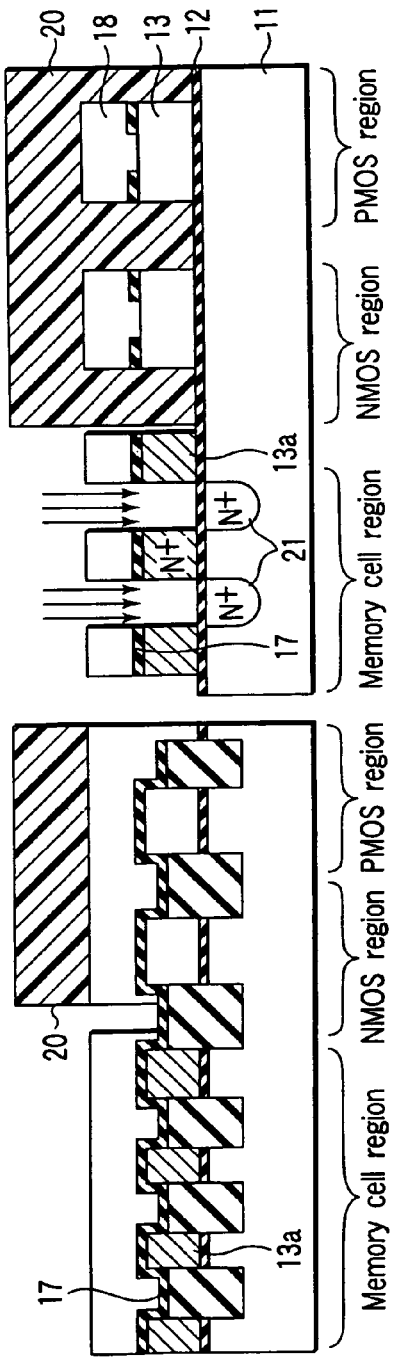
FIG. 20A
FIG. 20B
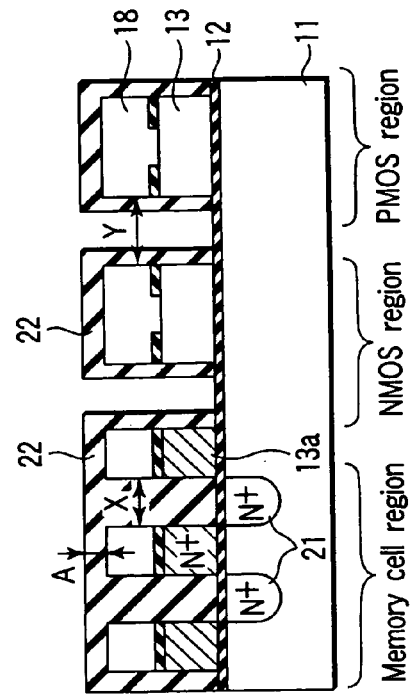
FIG. 21A
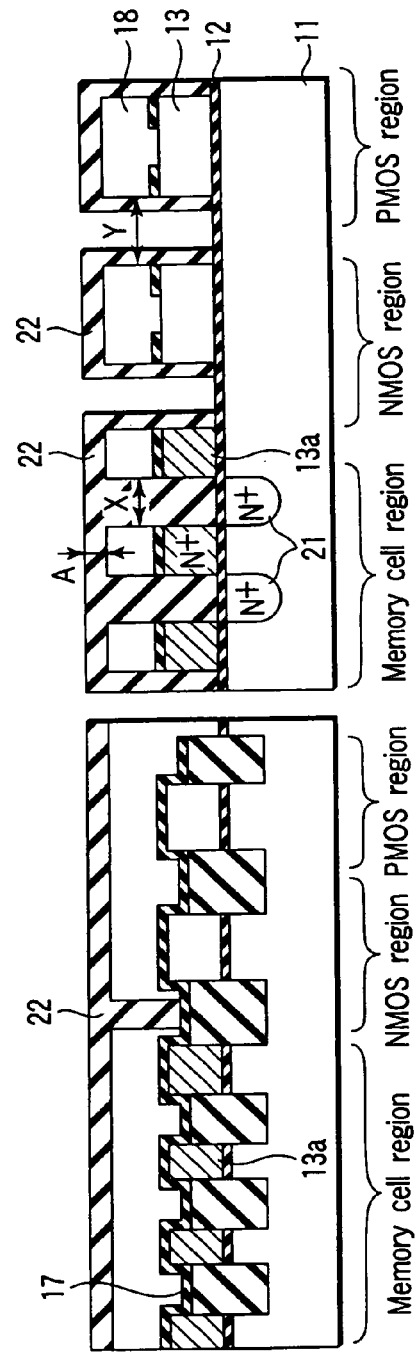
FIG. 21B

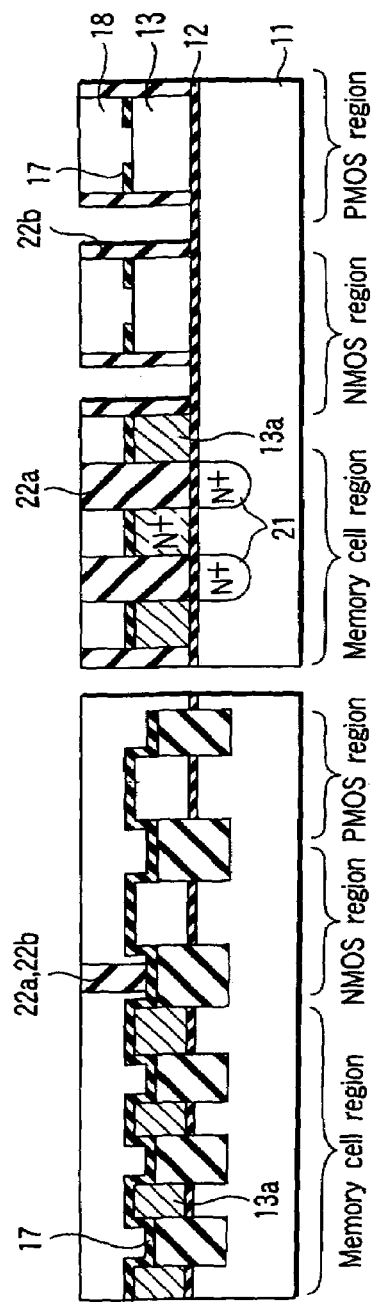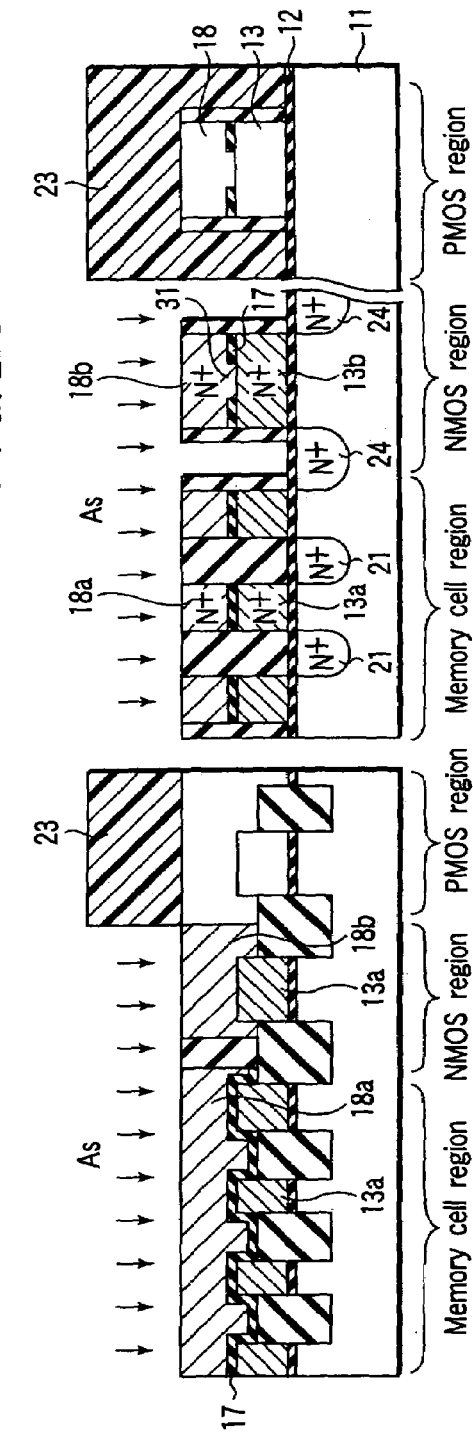

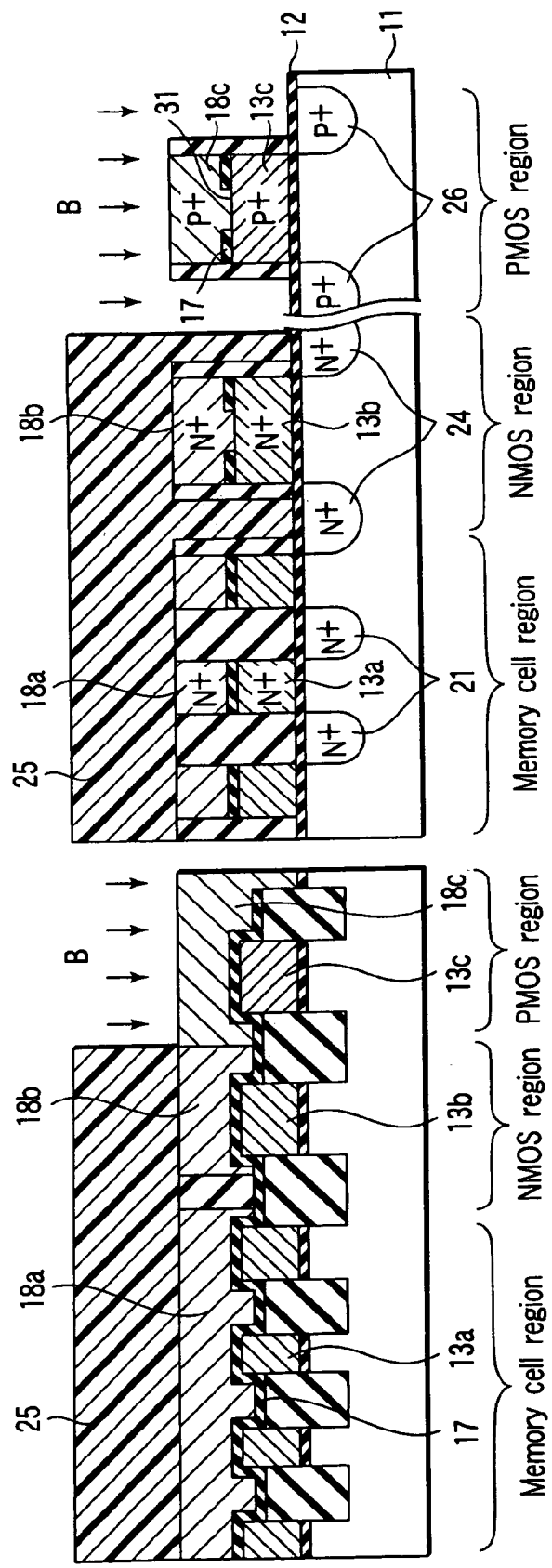

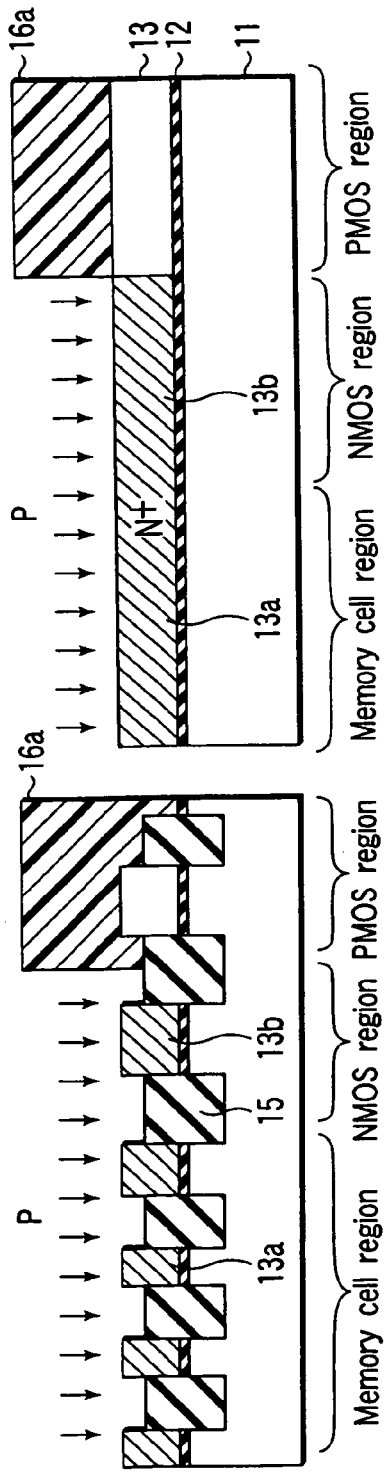
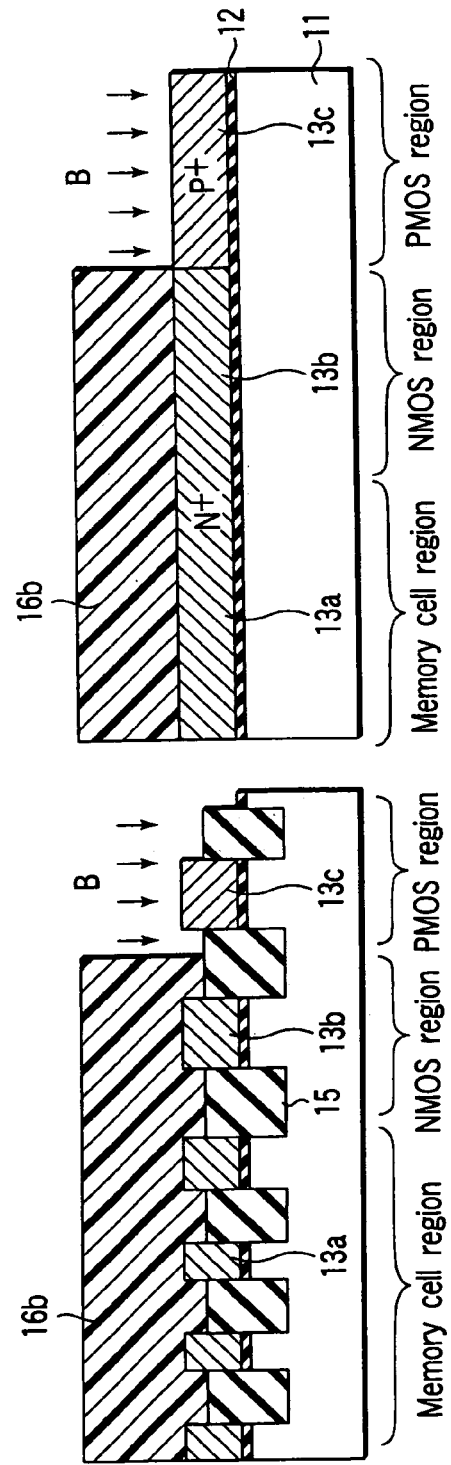
FIG. 25A  FIG. 25B  FIG. 26A  FIG. 26B

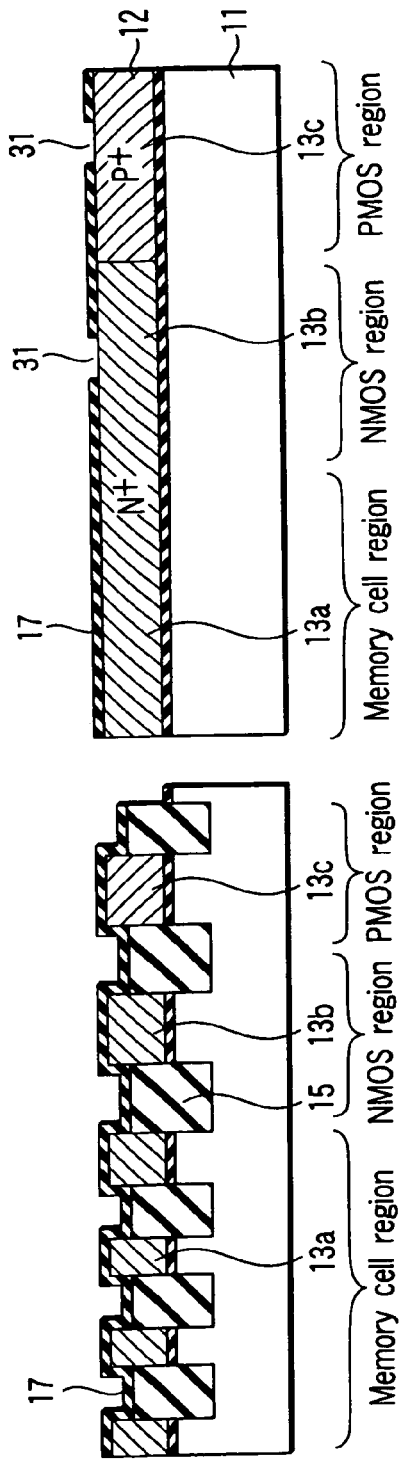
FIG. 27A
FIG. 27B
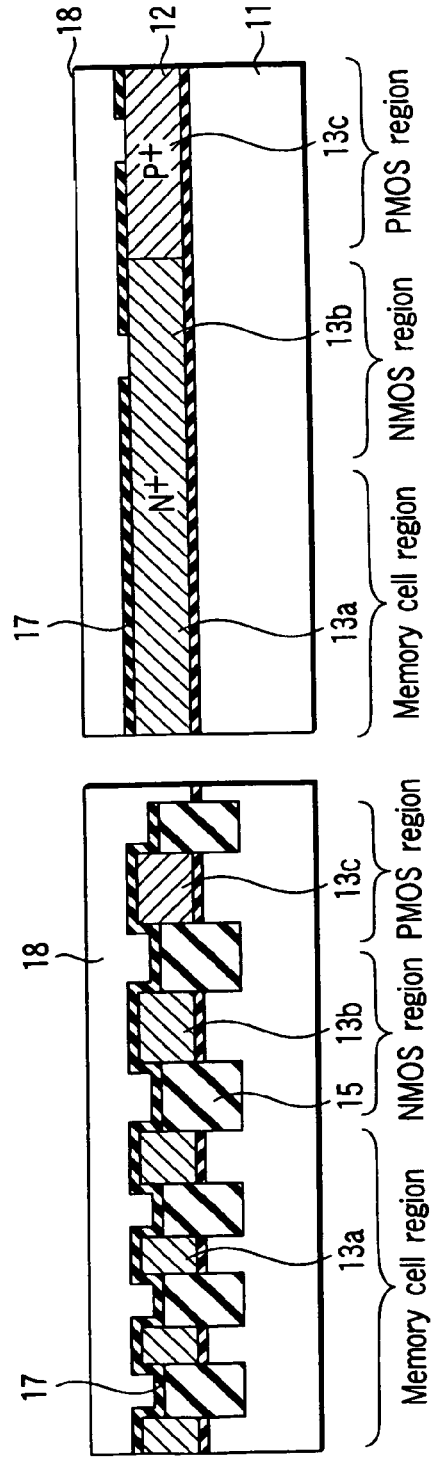
FIG. 28A
FIG. 28B

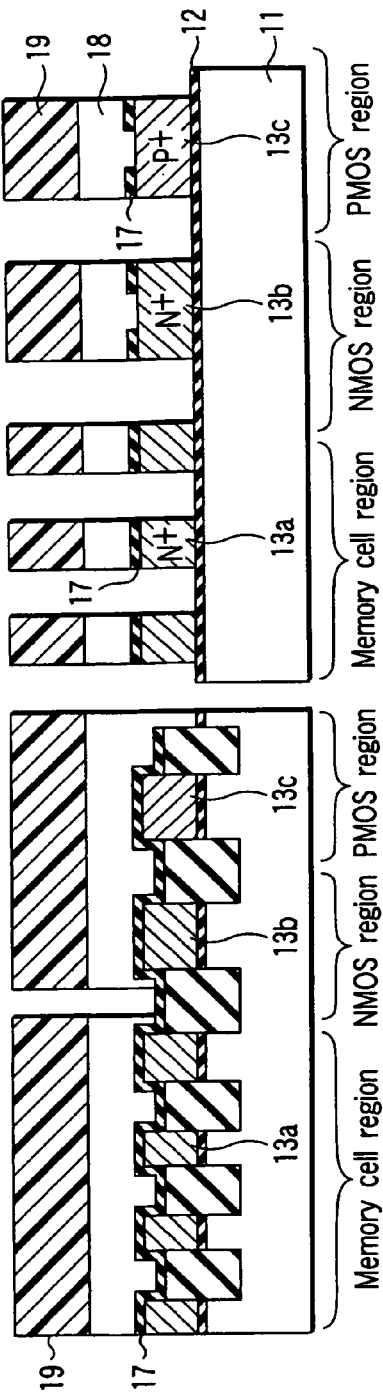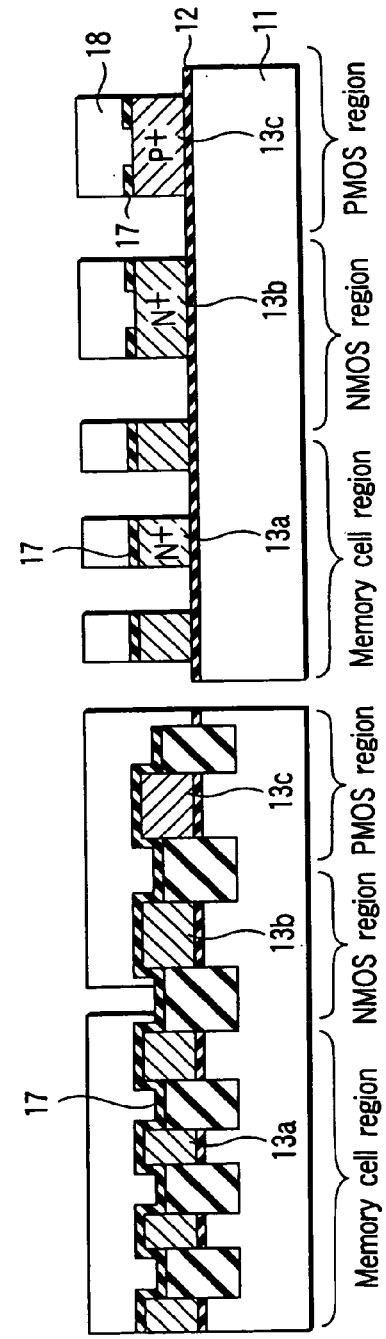

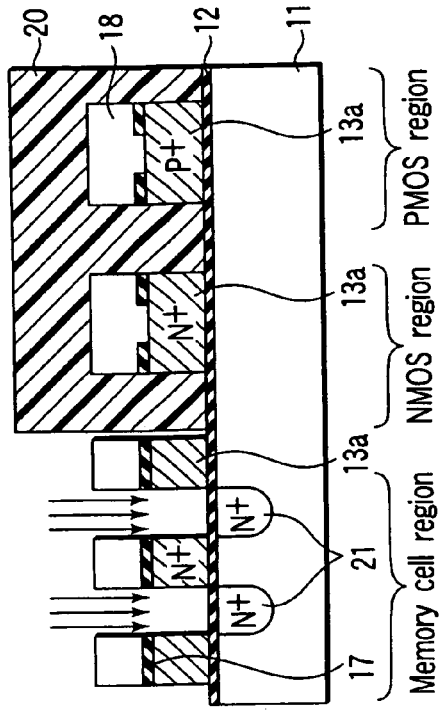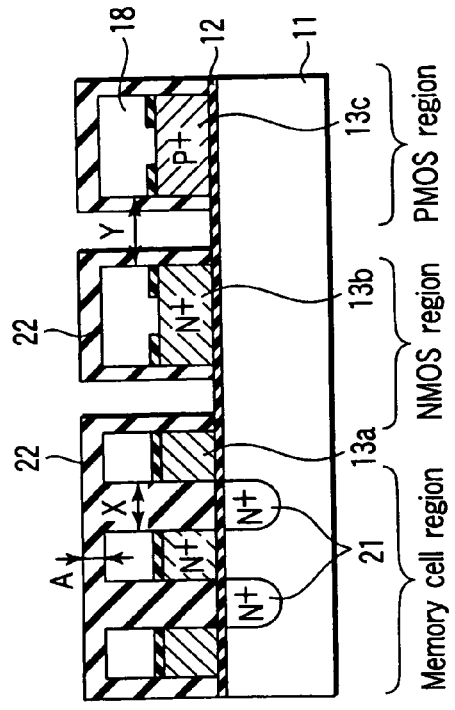
FIG. 31A  FIG. 31B  FIG. 32A  FIG. 32B

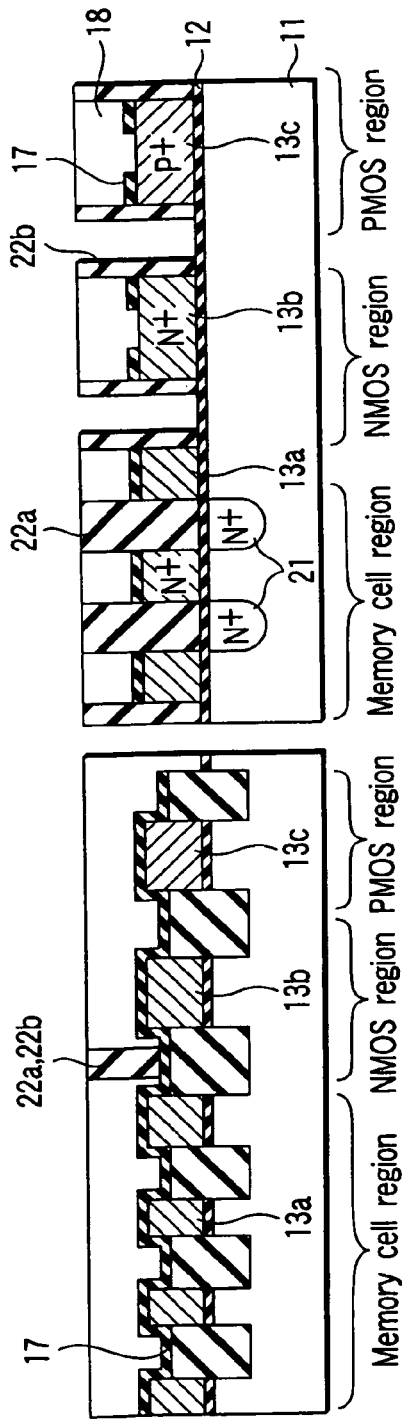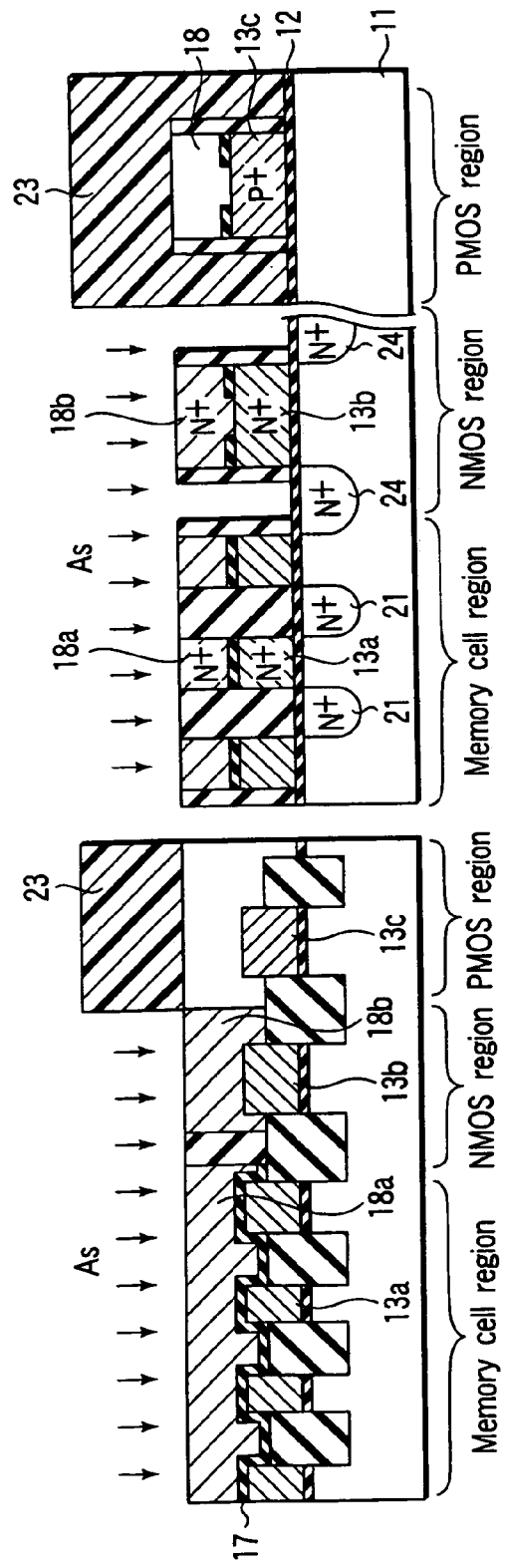
FIG. 33A FIG. 33B
FIG. 34A FIG. 34B

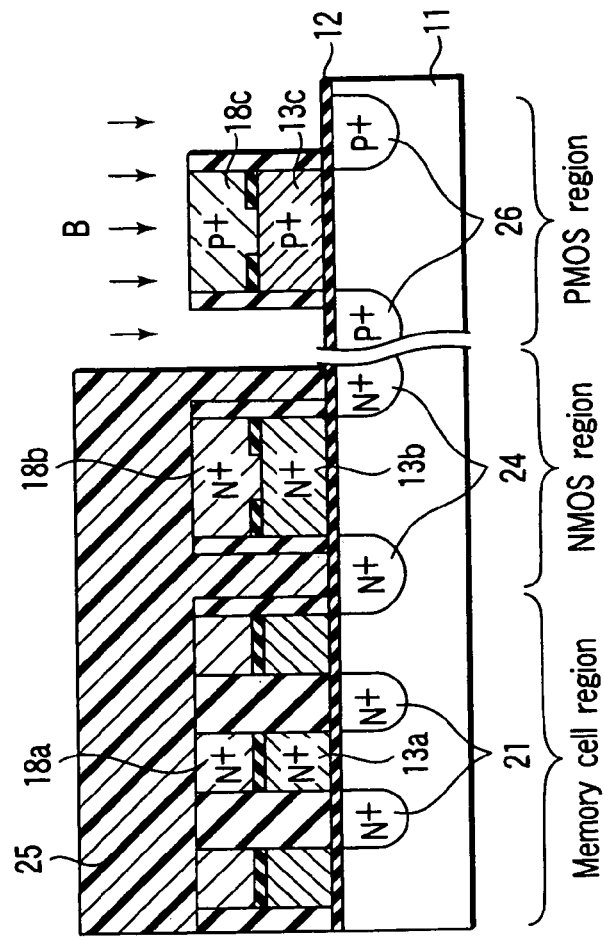
F I G. 35B
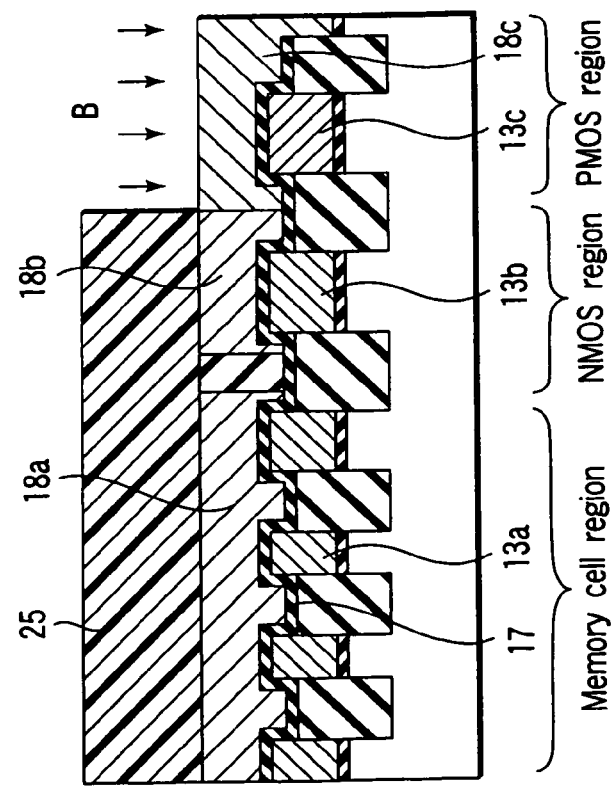
F I G. 35A

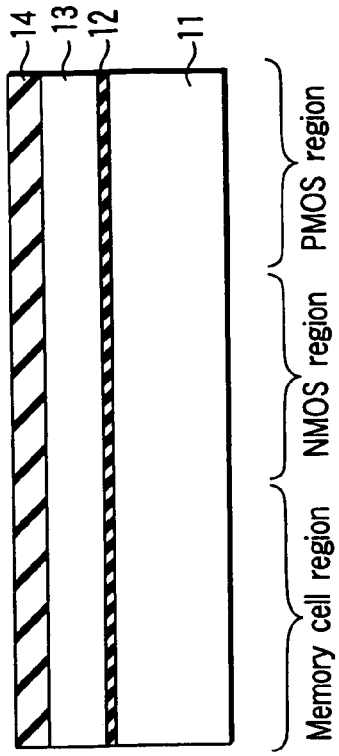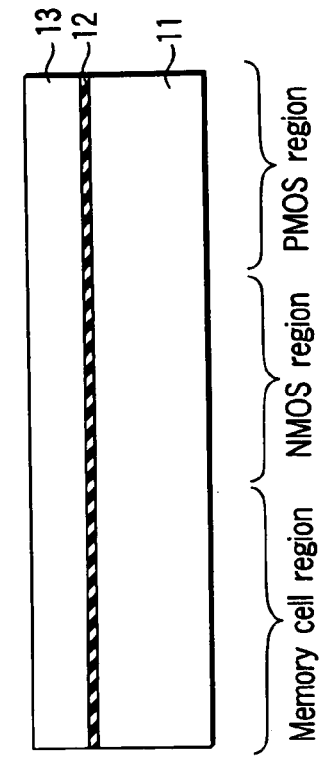
F I G. 58A PRIOR ART
F I G. 58B PRIOR ART
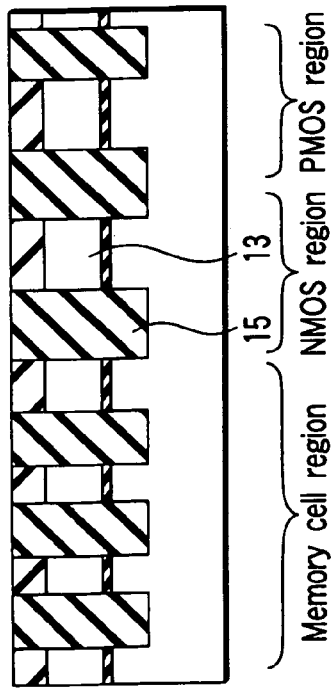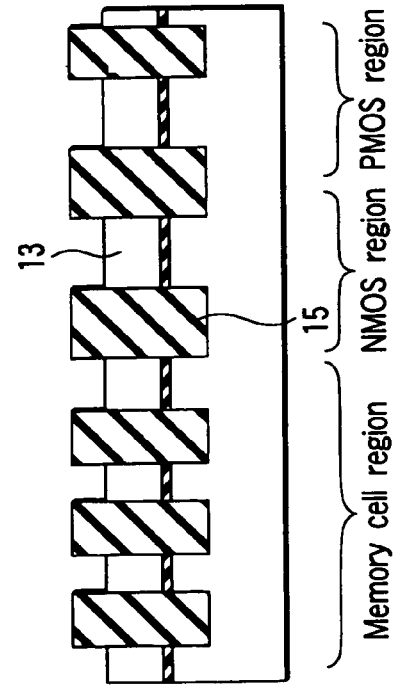
F I G. 59A PRIOR ART
F I G. 59B PRIOR ART

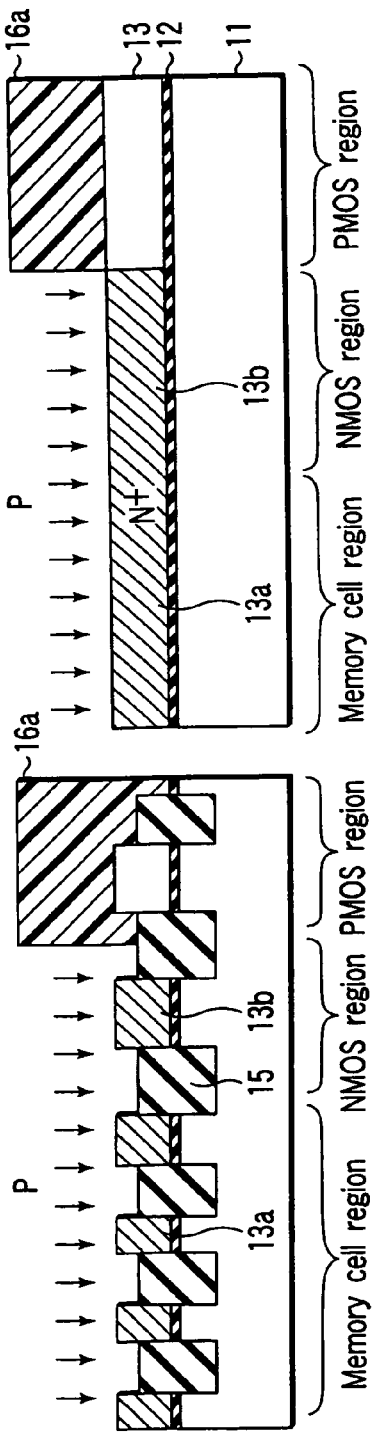
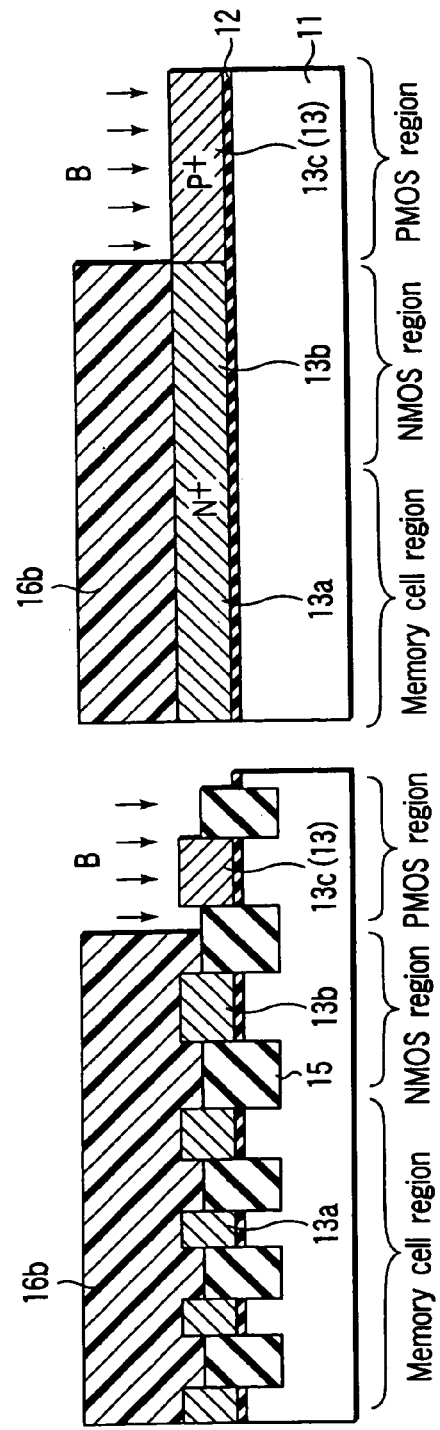
FIG. 60A PRIOR ART
FIG. 60B PRIOR ART
FIG. 61A PRIOR ART
FIG. 61B PRIOR ART

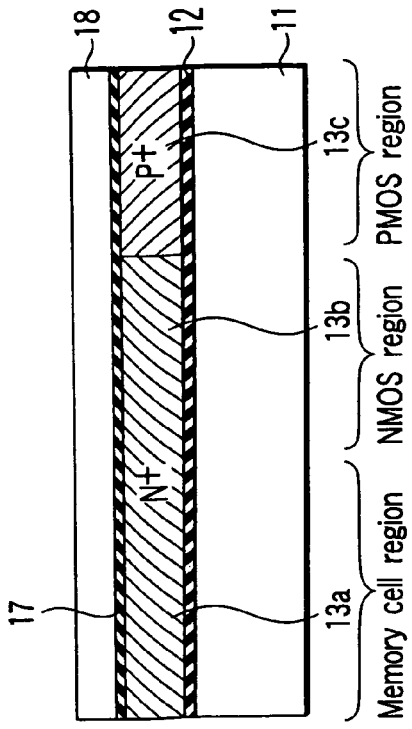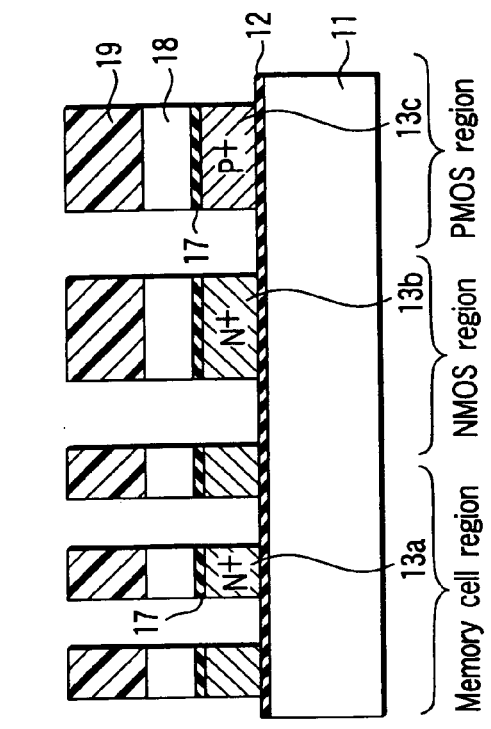
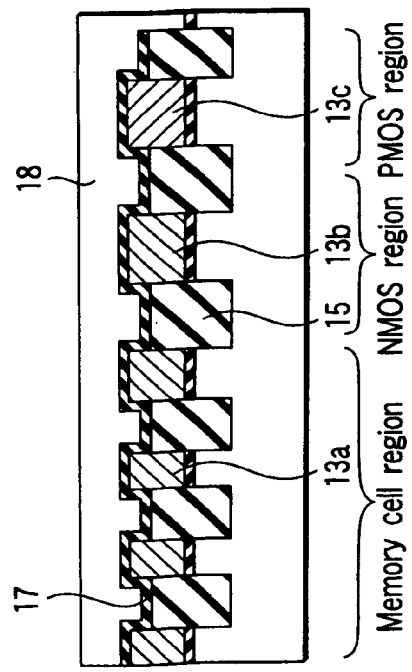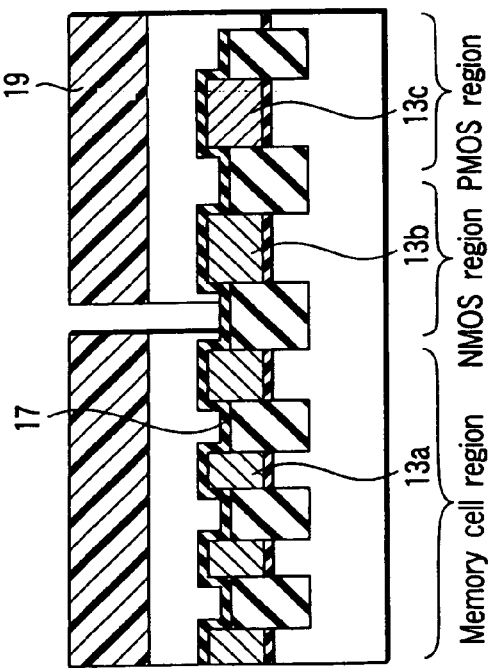
FIG. 62A PRIOR ART FIG. 62B PRIOR ART
FIG. 63A PRIOR ART FIG. 63B PRIOR ART

SEMICONDUCTOR MEMORY DEVICE EQUIPPED WITH MEMORY TRANSISTOR AND PERIPHERAL TRANSISTOR AND METHOD OF MANUFACTURING THE SAME

CROSS-REFERENCE TO RELATED APPLICATIONS

This application is a division of and claims the benefit of priority from U.S. Ser. No. 10/891,133, filed Jul. 15, 2004, now U.S. Pat. No. 7,067,872, which is a division of U.S. Ser. No. 10/214,582, Aug. 9, 2002, now abandoned, and is based upon and claims the benefit of priority from the prior Japanese Patent Applications No. 2001-244557, filed Aug. 10, 2001; and No. 2001-244558, filed Aug. 10, 2001, the entire contents of all of which are incorporated herein by reference.

BACKGROUND OF THE INVENTION

1. Field of the Invention

The present invention relates to a semiconductor memory device equipped with a memory transistor including a floating gate and a control gate and a peripheral transistor for controlling the memory transistor, and to a method of manufacturing the particular semiconductor memory device.

2. Description of the Related Art

A NAND type flash memory, which is a kind of nonvolatile memory, comprises a memory transistor in which a floating gate and a control gate are laminated one upon the other and a peripheral transistor is arranged to surround the periphery of the memory transistor. In many cases, the gate of the peripheral transistor is formed by using an electrode material equal to that of the floating gate of the memory transistor. The method of manufacturing the particular flash memory will now be described briefly with reference to the accompanying drawings.

FIGS. 58A, 58B to 66A, 66B are cross sectional views collectively showing a conventional method of manufacturing a semiconductor memory device. FIGS. 58A to 66A are cross sectional views perpendicular to the element separating region included in the memory cell region. On the other hand, FIGS. 58B to 66B are cross sectional views perpendicular to the gate electrode in the memory cell region.

In the first step, a first insulating film 12 forming a gate insulating film is formed on a semiconductor substrate (silicon substrate) 11, followed by forming a first electrode material layer 13 on the first insulating layer 12, as shown in FIGS. 58A and 58B. The first electrode material layer 13 is formed of a polycrystalline silicon (polysilicon) into which an impurity is not introduced. Then, a second insulating film 14 is formed on the first electrode material layer 13, followed by forming an element separating region of an STI (Shallow Trench Isolation) structure consisting of an element separating insulating film 15 such that the element separating insulating film 15 extends through the second insulating film 14, the first electrode material layer 13, and the first insulating film 12 into the semiconductor substrate 11.

In the next step, the element separating insulating film 15 is partly etched such that the upper surface of the element separating insulating film 15 is positioned lower than the upper surface of the first electrode material layer 13, followed by peeling off the second insulating film 14, as shown in FIGS. 59A and 59B.

Then, a resist layer 16a is formed on the first electrode material layer 13 in the PMOS region, as shown in FIGS. 60A and 60B. After formation of the resist layer 16a, ion implantation using, for example, phosphorus ions, is applied to the first electrode material layer 13 in the memory cell region with the resist layer 16a used as a mask, followed by applying anneal to the ion-implanted region so as to form $N^+$-type first conductive layers 13a, 13b. Incidentally, the reference numeral 13a shown in FIGS. 60A, 60B denotes the first conductive layer in the memory cell region, and the reference numeral 13b shown in FIGS. 60A, 60B denotes the first conductive layer in the NMOS region. It should also be noted that the first conductive layer 13a in the memory cell region performs the function of the floating gate of the memory transistor. After formation of the $N^+$-type first conductive layers 13a, 13b, the resist layer 16a is removed.

In the next step, a resist layer 16b is formed on the first conductive layers 13a, 13b as shown in FIGS. 61A, 61B. After formation of the resist layer 16b, ion implantation using, for example, boron ions is applied to the first electrode material layer 13 in the PMOS region, followed by applying annealing to the ion-implanted region so as to form a $P^+$-type first conductive layer 13c. After formation of the $P^+$-first conductive layer 13c, the resist layer 16b is removed.

Then, a third insulating film 17 is deposited over the first conductive layers 13a, 13b, 13c and the element separating insulating film 15, as shown in FIGS. 62A and 62B, followed by depositing a second electrode material layer 18 on the third insulating film 17. It should be noted that the second electrode material layer 18 is formed of polysilicon into which an impurity is not introduced.

In the next step, a resist layer 19 is formed on the second electrode material layer 18, followed by patterning the resist layer 19, as shown in FIGS. 63A, 63B. The patterned resist layer 19 is used as a mask in the next step for removing the second electrode material layer 18, the insulating film 17 and the first conductive layers 13a, 13b, 13c, thereby forming the gate patterns of the memory transistor and the peripheral transistor. Then, the resist layer 19 is removed, followed by a post-oxidation treatment.

Then, an insulating film 22 is formed on the side surface of the gate of the peripheral transistor, as shown in FIGS. 64A, 64B, followed by forming a resist layer 23 on the first insulating film 12 and the second electrode material layer 18 included in the PMOS region. The resist layer 23 thus formed is used as a mask in the subsequent step for introducing, for example, arsenic (As) ions as an impurity by means of ion implantation, followed by diffusing the introduced impurity by annealing. As a result, a second conductive layer 18a forming the control gate of the memory transistor and $N^+$-type source/drain diffusion layers 21 are formed in the memory cell region. On the other hand, a second conductive layer 18b and $N^+$-type source/drain diffusion layers 24 are formed in the NMOS region. Then, the resist layer 23 is removed.

In the next step, a resist layer 25 is formed on the first insulating film 12 and the second conductive layers 18a, 18b in the memory cell region and the NMOS region. After formation of the resist layer 25, ion implantation is performed by using, for example, boron ions as an impurity, followed by applying annealing to the ion-implanted region so as to diffuse the implanted boron ions. As a result, a second conductive layer 18c and $P^+$-type source/drain layers 26 are formed in the PMOS region. Then, the resist layer 25 is removed.

After removal of the resist layer 25, the first insulating layer 12 is removed so as to expose the source/drain diffusion layers 21, 24 and 26 to the outside, as shown in FIGS. 66A and 66B. Then, salicide (Self Aligned Silicide) films 27a, 27b, 27c, 27d consisting of a metal having a high melting point are formed on the second conductive layers 18a, 18b, 18c and the source/drain diffusion layers 21, 24, 26, respectively. In this fashion, a memory transistor 28 is formed in the memory cell region, and an NMOS transistor 29 and a PMOS transistor 30 are formed in the peripheral circuit region.

In the memory cell region of the conventional semiconductor memory device described above, the salicide film 27a is formed on the control gate formed on the second conductive layer 18a, and the salicide film 27d is also formed on the source/drain diffusion layer 21.

However, if the salicide film 27d is formed on the source/drain diffusion 21 of the memory cell region, it is possible for the reliability of the device characteristics such as the data retention characteristics and the data program/erase endurance cycle characteristics to be reduced in the flash memory. Also, where the salicide film 27d is also formed on the source/drain diffusion layer 21 of the memory cell region, a serious problem is brought about that the degree of freedom in terms of the element design of the source-drain of the memory cell device is markedly limited in order to satisfy both the formation of the electrode material and the device operation.

It was customary to use CMOS transistors of a dual work function gate in a nonvolatile memory for a low power consumption and in a high performance transistor requiring a high operating speed. The CMOS transistors include a surface channel type NMOS transistor and a surface channel type PMOS transistor. For forming these transistors, an electrode material into which an impurity is not introduced is deposited first. Then, arsenic (As) ions or phosphorus (P) ions, which are N-type impurities, are introduced by means of ion implantation into the gate region of the NMOS transistor, and boron (B) ions, which are P-type impurities, are introduced by means of ion implantation into the gate region of the PMOS transistor. What should be noted is that the gate electrode of the dual work function gate structure was formed in the past by separately implanting P-type and N-type impurities by light exposure technology with the N-type gate electrode and the P-type electrode used as masks. However, the conventional method of forming a gate electrode of the dual work function gate structure requires a large number of process steps and each process step is complex, leading to an increased manufacturing cost of the semiconductor memory device.

BRIEF SUMMARY OF THE INVENTION

According to a first aspect of the present invention, there is provided a semiconductor memory device provided with a memory cell region having first gate electrodes and a peripheral circuit region having second gate electrodes includes: first gate electrodes arranged a first distance apart from each other on a semiconductor substrate; second gate electrodes arranged a second distance, which is larger than the first distance, apart from each other on the semiconductor substrate; first diffusion layers formed in the semiconductor substrate, the first diffusion layers sandwiching the first gate electrodes; second diffusion layers formed in the semiconductor substrate, the second diffusion layers sandwiching the second gate electrodes; a first insulating film formed on the first diffusion layer; second insulating films formed on the side surfaces of the second gate electrodes; first silicide films formed on the first gate electrodes; second silicide films formed on the second gate electrodes; and third silicide films formed on the second diffusion layers.

BRIEF DESCRIPTION OF THE SEVERAL VIEWS OF THE DRAWING

FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A and 14B are cross sectional views collectively showing the process of manufacturing a semiconductor memory device according to the first embodiment of the present invention;

FIGS. 16A, 16B, 17A, 17B, 18A, 18B, 19A, 19B, 20A, 20B, 21A, 21B, 22A, 22B, 23A, 23B, 24A and 24B are cross sectional views collectively showing the process of manufacturing a semiconductor memory device according to the second embodiment of the present invention;

FIGS. 25A, 25B, 26A, 26B, 27A, 27B, 28A, 28B, 29A, 29B, 30A, 30B, 31A, 31B, 32A, 32B, 33A, 33B, 34A, 34B, 35A and 35B are cross sectional views collectively showing the process of manufacturing a semiconductor memory device according to a third embodiment of the present invention;

FIGS. 58A, 58B, 59A, 59B, 60A, 60B, 61A, 61B, 62A, 62B, 63A, 63B, 64A, 64B, 65A, 65B, 66A and 66B are cross sectional views collectively showing the conventional manufacturing process of a semiconductor memory device.

DETAILED DESCRIPTION OF THE INVENTION

Some embodiments of the present invention will now be described with reference to the accompanying drawings.

First Embodiment

The first embodiment is directed to an example of the construction where a silicide film is not formed on the diffusion layer of the memory transistor, and all the insulating films between the first and second conductive layers constituting the gates of the peripheral transistor are removed. The first embodiment is directed to a NAND type flash memory. However, it is possible to apply the technical idea of the present invention to other memories, e.g., a memory in which AND type memory cells are arranged to form a row, as far as the memory is constructed such that a selecting gate is formed on one side or both sides of the memory cell.

Figures 1A, 1B:
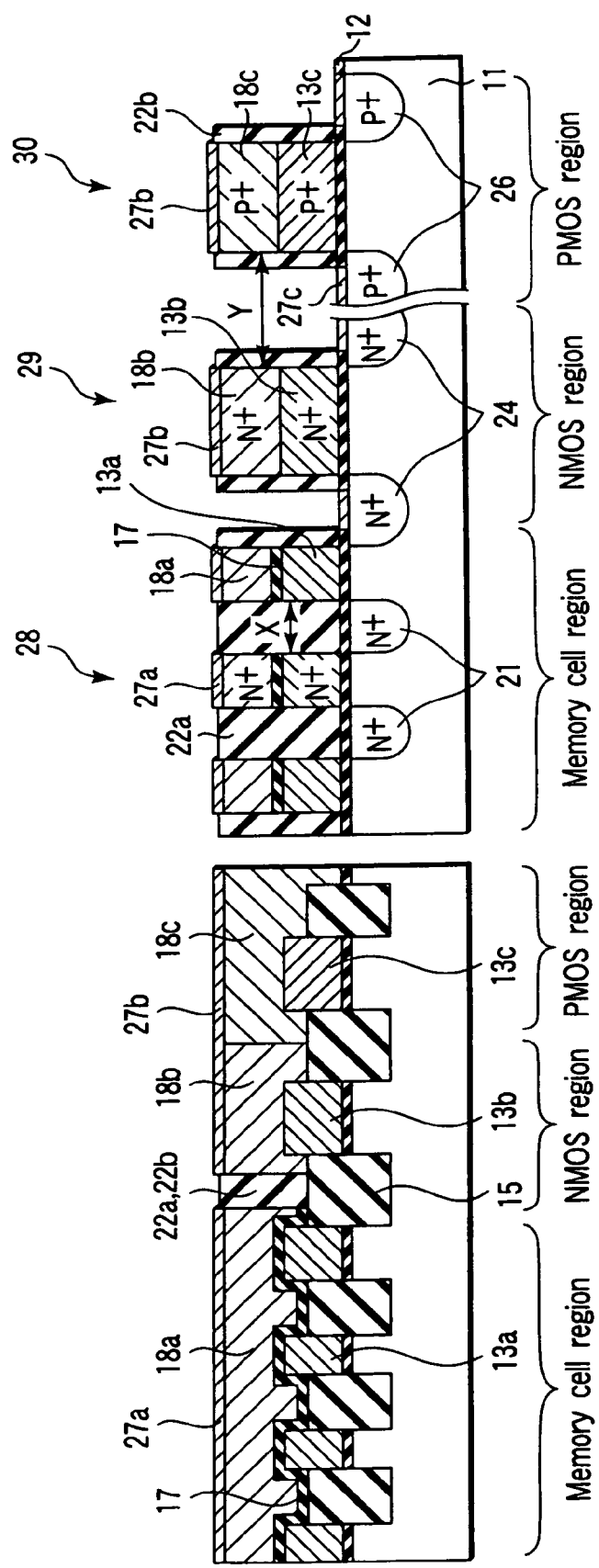
FIGS. 1A and 1B are cross sectional views collectively showing the construction of a semiconductor memory device according to a first embodiment of the present invention.

FIGS. 1A and 1B are cross sectional views collectively showing the construction of a semiconductor memory device according to a first embodiment of the present invention. It should be noted that FIG. 1A is a cross sectional view perpendicular to the element separating region of the memory cell, and FIG. 1B is a cross sectional view perpendicular to the gate electrode of the memory cell region.

As shown in FIGS. 1A and 1B, the semiconductor memory device according to the first embodiment of the present invention is provided with a memory cell region and a peripheral circuit region consisting of an NMOS region and a PMOS region. In the memory cell region, gates of a memory transistor 28 are formed a first distance X apart from each other, and gates of an NMOS peripheral transistor 29 and a PMOS peripheral transistor 30 are formed a second distance Y, which is larger than the first distance X, apart from each other. The gate of the memory transistor 28 includes a first conductive layer 13a forming a floating gate and a second conductive layer 18a forming a control gate. As shown in the drawing, an insulating film 17 is formed between the first and second conductive layers 13a and 18a. On the other hand, the gate of the peripheral transistor 29 includes a first conductive layer 13b and a second conductive layer 18b. Likewise, the gate of the peripheral transistor 30 includes a first conductive layer 13c and a second conductive layer 18c. It should be noted that an insulating film is not formed between the first conductive layer 13b and the second conductive layer 18b. Also, an insulating film is not formed between the first conductive layer 13c and the second conductive layer 18c. The clearance between the gates of the memory transistor 28 is filled with an insulating film 22a, and an insulating film 22b is formed on each of the side surfaces of the peripheral transistors 29 and 30. The insulating films 22a and 22b are formed simultaneously by the same material. First diffusion layers 21 are formed within the semiconductor substrate (silicon substrate) 11 in a manner to have the gate of the memory transistor 28 sandwiched therebetween. Also, second diffusion layers 24 are formed within the semiconductor substrate 11 in a manner to have the gate of the peripheral transistor 29 sandwiched therebetween. Further, second diffusion layers 26 are formed within the semiconductor substrate 11 in a manner to have the gate of the peripheral transistor 30 sandwiched therebetween. Salicide (Self Aligned Silicide) films 27a, 27b, and 27c are formed on the gate of the memory transistor 28, on the gates of the peripheral transistors 29, 30, and on the second diffusion layers 24, 26. It should be noted that a salicide film is not formed on the diffusion layer 21 of the memory transistor 28. The salicide films 27a, 27b, and 27c are silicide films formed in self-aligned with a gate.

Incidentally, the clearance between the gates of the memory transistor 28 is filled with the insulating film 22a. However, it is not absolutely necessary for the clearance noted above to be filled completely with the insulating film 22a. It is possible for small clearances such as voids to be present inside the insulating film 22a as far as a salicide film is not formed on the diffusion layer 21. Also, FIG. 1A shows that the insulating film 22a is deposited to reach the surface of the gate of the memory transistor. However, it is not absolutely necessary for the insulating film 22a to be deposited to reach the surface of the gate of the memory transistor, as far as the surface of the diffusion layer 21 is covered with the insulating film 22a. Further, it is possible for the gate of the memory transistor 28 and the gate of the peripheral transistor 29 to be arranged, for example, a second distance Y apart from each other.

FIGS. 2A, 2B to 14A, 14B are cross sectional views collectively showing the manufacturing process of the semiconductor memory device according to the first embodiment of the present invention. The manufacturing process of the semiconductor memory device according to the first embodiment of the present invention will now be described with reference to FIGS. 2A, 2B to 14A, 14B.

Figure 2A:
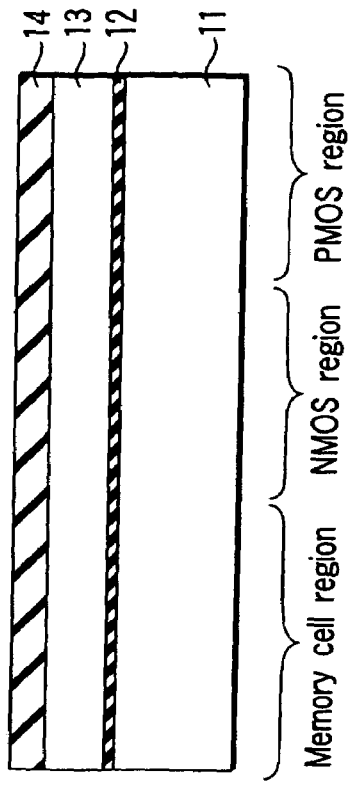
Figure 2B:
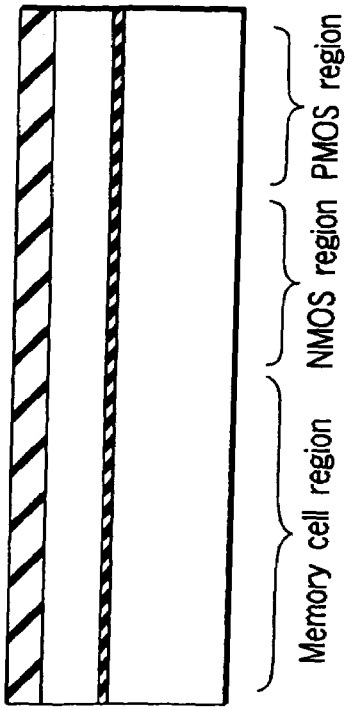

In the first step, a first insulating film 12 forming a gate insulating film is formed on a semiconductor substrate 11, as shown in FIGS. 2A and 2B. The first insulating film 12 has a thickness of, for example, about 100 Å. Then, a first electrode material layer 13 is formed on the first insulating film 12. The first electrode material layer 13 consists of polysilicon into which an impurity is not introduced. Then, a second insulating film 14 consisting of silicon nitride is formed on the first electrode material layer 13. Incidentally, an impurity is introduced into the channel region and the well region by means of ion implantation before formation of the first insulating film 12 in order to control the channel regions of the memory transistor and the peripheral transistor.

In the next step, the second insulating film 14, the first electrode material layer 13, the first insulating film 12 and the semiconductor substrate 11 are selectively removed so as to form grooves for element separation. An insulating film 15 for the element separation, which consists of, for example, a silicon oxide film, is deposited within the groove for the element separation, followed by planarizing the insulating film 15 for the element separation until the surface of the second insulating film 14 is exposed to the outside. In other words, the second insulating film 14 performs the function of a stopper film in planarizing the insulating film 15 for the element separation. In this fashion, an element separating region of an STI (Shallow Trench Isolation) structure, which consists of the insulating film 15 for the element separation, is formed.

After formation of the element separating region, the insulating film 15 for the element separation is partly etched such that the surface of the insulating film 15 for the element separation is positioned lower than the surface of the first electrode material layer 13, followed by peeling off the second insulating film 14, as shown in FIGS. 4A and 4B.

In the next step, a resist layer 16 is formed on the first electrode material layer 13, followed by patterning the resist layer 16 such that the resist layer 16 is left unremoved on only the peripheral circuit region. Then, ion implantation is applied to the first electrode material layer 13 in the memory cell region with the patterned resist layer 16 used as a mask, followed by applying annealing to the ion-implanted region of the first electrode material layer 13 so as to form a first conductive layer 13a. Where the memory transistor is formed of an NMOS transistor, the ion implantation is performed by using, for example, phosphorus (P) ions as an N-type impurity under the condition that the first conductive layer 13a has an impurity concentration of, for example, about $2\times10^{20}$ cm$^{-3}$. Incidentally, it is conceivable to use arsenic (As) as the N-type impurity in place of P. The first conductive layer 13a formed as described above performs the function of the floating gate of the memory transistor. After formation of the first conductive layer 13a, the resist layer 16 is removed.

In the next step, a third insulating film 17 consisting of, for example, an ONO (Oxide Nitride Oxide) film is deposited to cover the first electrode material layer 13, the first conductive layer 13a and the insulating film 15 for the element separation, as shown in FIGS. 6A, 6B. Then, the third insulating film 17 in the peripheral circuit region is removed such that the third insulating film 17 is left unremoved in the memory cell region alone.

Further, a second electrode material layer 18 is deposited on the third insulating film 17, the first electrode material layer 13 and the insulating film 15 for the element separation, as shown in FIGS. 7A and 7B. It should be noted that the second electrode material layer 18 is formed of polysilicon into which an impurity is not introduced.

In the next step, a resist layer 19 is formed on the second electrode material layer 18, followed by patterning the resist layer 19, as shown in FIGS. 8A and 8B. Then, the first and second electrode material layers 13, 18, the first conductive layer 13a and the third insulating film 17 are removed with the patterned resist layer 19 used as a mask, thereby forming the gate patterns of the memory transistor and the peripheral transistor.

Figures 10A, 10B:
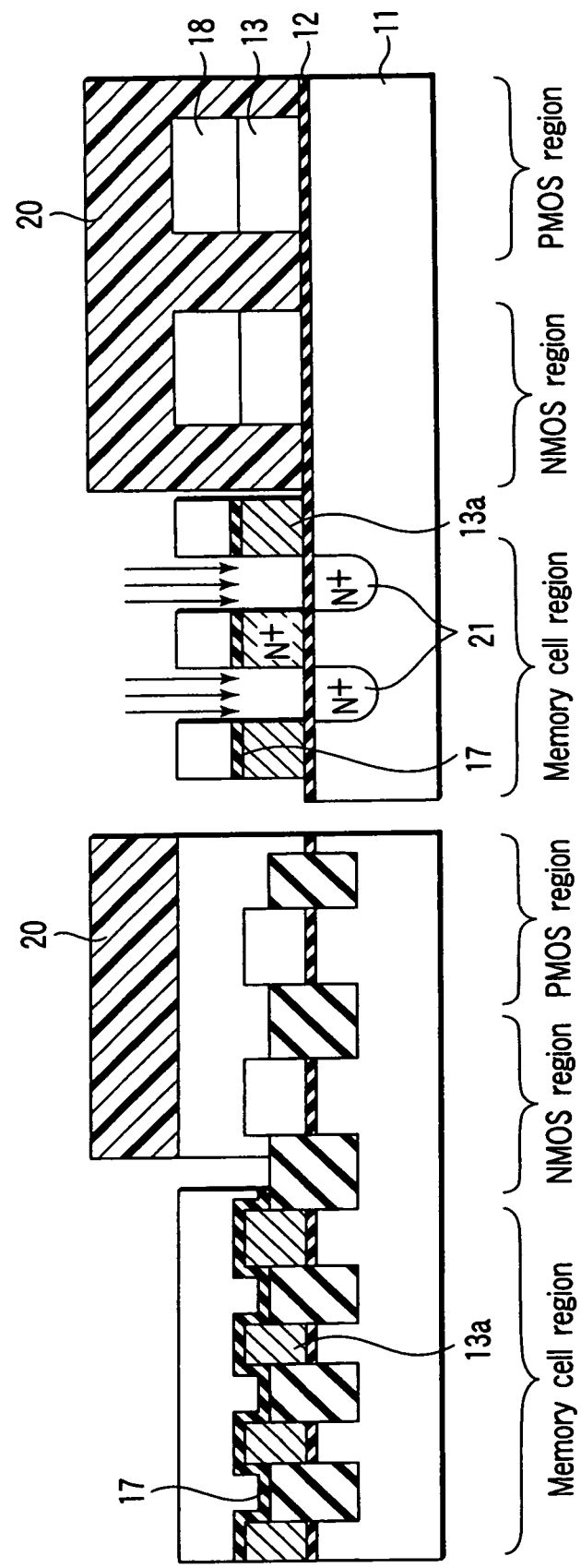

In the next step, the resist layer 19 is removed as shown in FIGS. 9A and 9B. Then, a post-oxidation is performed so as to form an oxide film (not shown) on the gate. Further, a resist layer 20 is formed to cover the first insulating film 12 and the second electrode material layer 18, followed by patterning the resist layer 20 such that the resist layer 20 is left unremoved in the peripheral region alone, as shown in FIGS. 10A and 10B. Further, ion implantation is performed with the patterned resist layer 20 used as a mask so as to form source/drain diffusion layers 21 within the semiconductor substrate 11 in the memory cell region. Where the memory transistor consists of an NMOS transistor, P or As is used as the impurity. Then, the resist layer 20 is removed.

Figure 11A:
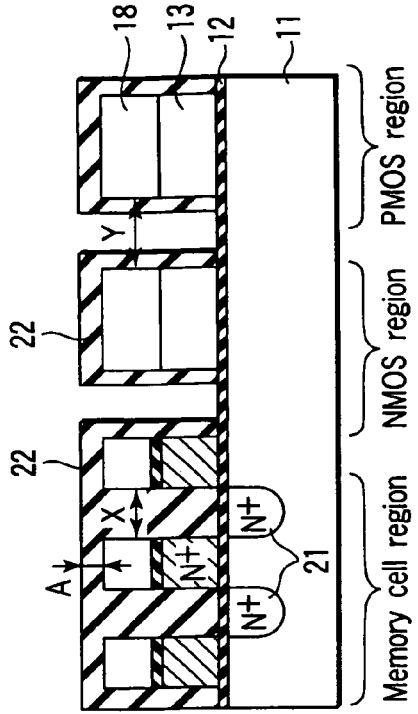
Figure 11B:
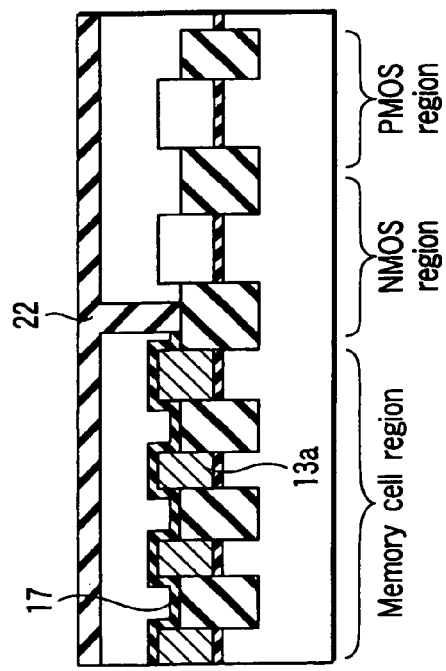

In the next step, a fourth insulating film 22 is formed to cover the first insulating film 12 and the second electrode material layer 18, as shown in FIGS. 11A and 11B. In this case, the fourth insulating film 22 is formed to full completely the clearance between the gates of the memory cell region and not to fill the clearance between the gates of the peripheral circuit region. In other words, the thickness A of the fourth insulating film 22 is determined to satisfy formula (1) given below:

$$X/2 \leq A < Y/2 \quad (1)$$

where X represents the distance between the gates of the memory cell region, Y represents the distance between the gates of the peripheral circuit region, and A represents the thickness of the fourth insulating film 22.

For example, where the distance X between the gates of the memory cell region is set at F (minimum processing size) and the distance Y between the gates of the peripheral circuit region is set at 2F to 3F, the thickness A of the fourth insulating film 22 is set to satisfy the relationship of formula (2) given below:

$$F/2 \leq A < F \text{ to } 3F/2 \quad (2)$$

Incidentally, it is possible for the distance Y between the gates of the peripheral circuit region to be 1.3 to 5.0 times as much as the distance X between the gates of the memory cell region. In this case, it is possible for the gate of the selecting transistor to be included in the gates of the peripheral circuit region.

Also, it is desirable for the fourth insulating film 22 to be formed of an oxide film. In other words, the fourth insulating film 22 is formed of, for example, a TEOS (Tetra Ethyl Ortho Silicate) film, an ozone TEOS film, an HTO (High Temperature Oxide) film, an SOG (spin On Glass) film, a coating type oxide film, an SA-CVD (Semi Atmospheric—Chemical Vapor Deposition) film, a plasma CVD film, or a PSG (Phosphorus Silicate Glass) film.

Figure 12A:
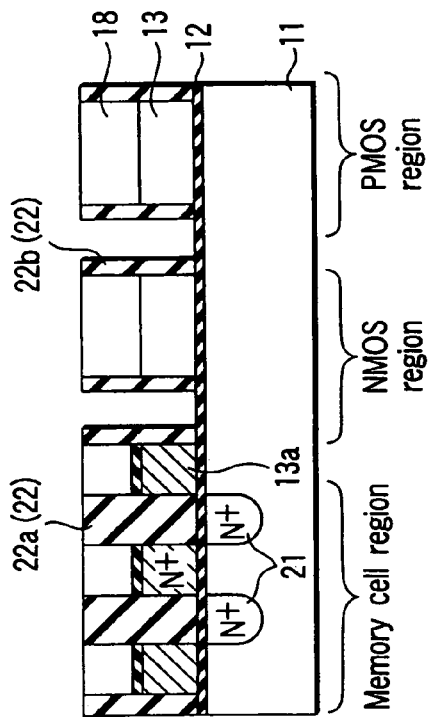
Figure 12B:
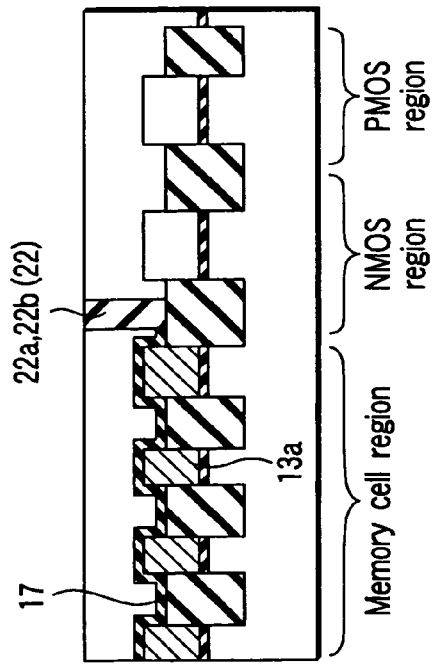

In the next step, the fourth insulating film 22 is etched back so as to expose the surfaces of the second electrode material layer 18, the first insulating film 12 or the diffusion layer region of the peripheral transistor, as shown in FIGS. 12A and 12B. As a result, a buried insulating film 22a is formed in the clearance between the gates in the memory cell region, and a side wall insulating film 22b is formed on the side surface of each of the gates in the peripheral circuit region.

Figure 13A:
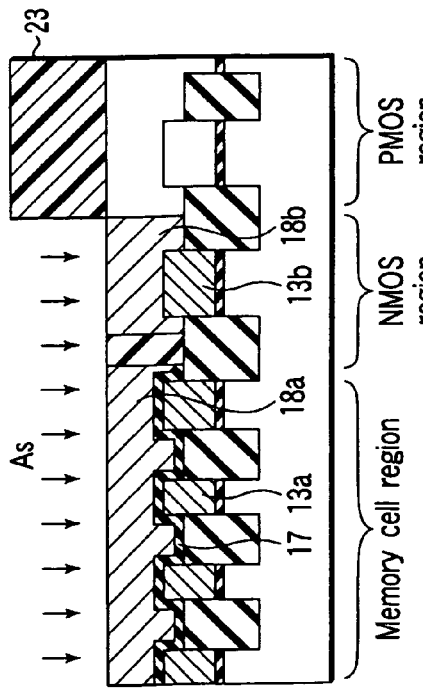
Figure 13B:
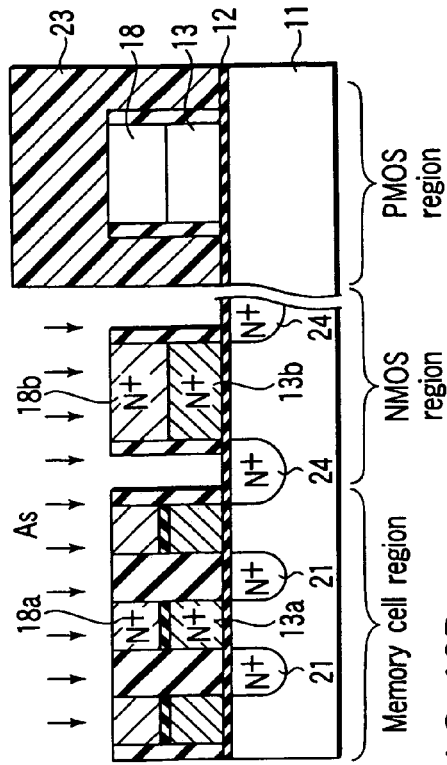
Figure 14A:
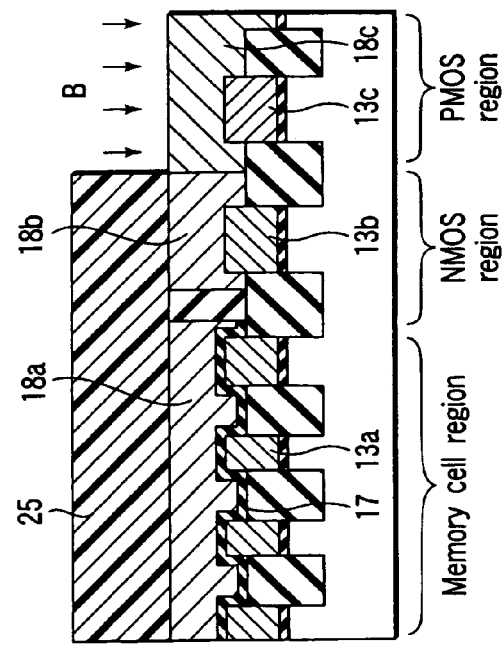
Figure 14B:
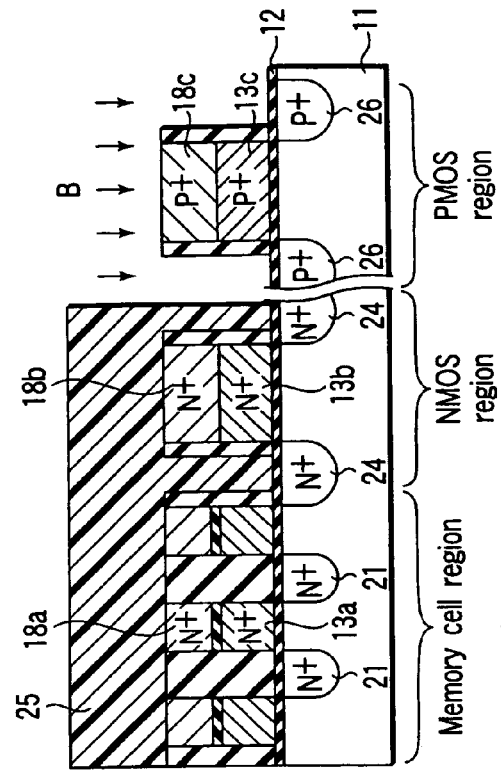

Further, a resist layer 23 is formed to cover the first insulating film 12 and the second electrode material layer 18, followed by patterning the resist layer 23 such that the resist layer 23 is left unremoved in the PMOS region alone, as shown in FIGS. 13A and 13B. Then, ion implantation using, for example, arsenic (As) ions as an impurity is performed with the patterned resist layer 23 used as a mask under the conditions that the accelerating energy is set at scores of KeV and the dose of the impurity is set at about $10^{15}$ cm$^{-2}$. In other words, an impurity is introduced into the second electrode material layer 18 in the memory cell region, the second electrode material layer 18 in the NMOS region, and the semiconductor substrate 11. Then, the introduced impurity is diffused by annealing so as to form a second conductive layer 18a in the memory cell region. Also, first and second conductive layers 13b, 18b and N$^+$-type source/drain diffusion layers 24 are formed in the NMOS region. It should be noted that the first conductive layer 13b of the NMOS region is formed by diffusing the impurity introduced into the second electrode material layer 18 of the NMOS region into the first electrode material layer 13 of the NMOS region. After formation of the first conductive layer 13b, etc, referred to above, the resist layer 23 is removed.

In the next step, a resist layer 25 is formed to cover the first insulating film 12 and the second electrode material layer 18, followed by patterning the resist layer 25 such that the resist layer 25 is left unremoved in only the memory cell region and the NMOS region. Then, ion implantation using, for example, boron (B) ions as an impurity is performed with the patterned resist layer 25 used as a mask under the conditions that the accelerating energy is set at scores of KeV and the dose of the impurity is set at about $10^{15}$ cm$^{-2}$. In other words, an impurity is introduced into the second electrode material layer 18 in the PMOS region and into the semiconductor substrate 11. Then, the introduced impurity is diffused by annealing so as to form first and second conductive layers 13c, 18c and P$^+$-type source/drain diffusion layers 26 in the PMOS region. It should be noted that the first conductive layer 13c of the PMOS region is formed by diffusing the impurity introduced into the second electrode material layer 18 of the PMOS region into the first electrode material layer 13 of the PMOS region. After formation of the first and second conductive layers 13c, 18c, etc., the resist layer 25 is removed.

In the next step, the oxide film on the gate is removed so as to expose the surface of the gate to the outside and, at the same time, the first insulating film 12 is removed so as to expose the source/drain diffusion layers 24, 26 of the peripheral transistor to the outside, as shown in FIGS. 1A and 1B. Then, a film of a metal having a high melting point such as Co (cobalt), Ti (titanium) or Ni (nickel) is deposited to cover the second conductive layers 18a, 18b, 18c, the buried insulating film 22a, the side wall insulating film 22b and the source/drain diffusion layers 24, 26, followed by applying annealing to the film of the high melting point metal so as to carry out the reaction between the metal having a high melting point and silicon. As a result, the salicide films 27a, 27b, 27c are formed on the second conductive layer 18a of the memory cell region, on the second conductive layers 18b, 18c of the peripheral circuit region, and on the source/drain diffusion layers 24, 26, respectively. After formation of the salicide films 27a, 27b, 27c, the unreacted film of the high melting point metal is removed. As a result, the memory transistor 28 in which a salicide film is not formed on the diffusion layer 21 is formed in the memory cell region, and the NMOS transistor 29 and the PMOS transistor 30 in which the salicide films 27c are formed on the diffusion layers 24, 26 are formed in the peripheral circuit region.

Incidentally, after the element forming process described above, a known technology is employed for depositing an interlayer insulating film (not shown) on the gate electrode, for forming a contact (not shown) consisting of, for example, tungsten (W) within the interlayer insulating film, and for forming a wiring layer (not shown) connected to the contact.

It is possible for the memory transistor 28 to be of P-type. In this case, an impurity is introduced into the first and second electrode material layers 13, 18 of the memory transistor 28 simultaneously with the introduction of an impurity into the first and second electrode material layers 13, 18 of, for example, the PMOS transistor 30.

Also, it is possible for the diffusion layers 24, 26 of the peripheral transistors 29, 30 to be of an LDD (Lightly Doped Drain) structure or of a DDD (Double Diffused Drain) structure. To be more specific, it suffices to form $N^-$-type and $P^-$-type diffusion layers in the NMOS region and the PMOS region, respectively, in prescribed regions of the semiconductor substrate 11 before deposition of the fourth insulating layer 22, followed by forming the $N^+$-type diffusion layer 24 and the $P^+$-type diffusion layer 26 as described above.

Also, since the surface of the semiconductor substrate 11 in the diffusion layer region of the peripheral transistor and the surface of the second electrode material layer 19 are exposed to the outside by the etching back of the fourth insulating film 22 in the process step shown in FIGS. 12A and 12B, it is possible to form a protective layer on each of the surfaces of the semiconductor substrate 11 and the second electrode material layer 18 noted above. To be more specific, it suffices to form a protective film by oxidizing each of these surfaces so as to form a thin oxide film or by depositing an oxide film on each of these surfaces, followed by removing the protective film after the ion implantation and activating step and before formation of the salicide films 27a, 27b, 27c shown in FIGS. 13A, 13B and 14A, 14B.

It is possible to omit the etch back step shown in FIGS. 12A and 12B. In this case, after deposition of the fourth insulating film 22 shown in FIGS. 11A and 11B, the ion implantation and activating step shown in FIGS. 13A, 13B and 14A, 14B is carried out. In performing the ion implantation treatment, it is necessary to control the accelerating energy such that the accelerated ions pass through the fourth insulating film 22 deposited on the second electrode material layer 18 and on the first insulating film 12 so as to be implanted into the second electrode material layer 18 and into the semiconductor substrate 11.

According to the first embodiment of the present invention described above, the buried insulating film 22a is formed in the clearance between the gates of the memory transistor, with the result that a salicide film is not formed on the diffusion layer 21 and the floating gate of the memory transistor 28. As a result, the characteristics of the memory cell region as a flash memory are not affected by the salicide film formation so as to make it possible to prevent the reliability in the device characteristics of the memory transistor 28 from being lowered by the salicide film formation. It should also be noted that the salicide films 27b, 27c are formed on the gate and on the diffusion layers 24, 26 in the peripheral transistors 29, 30, respectively. It follows that it is possible to lower the resistance of the gate and the diffusion layers 24, 26 of the peripheral transistors 29, 30 and to lower the resistance of the control gate of the memory transistor 28. It should be noted that the lowered resistance in each of the gate and the diffusion layers 24, 26 of the peripheral transistors 29, 30 controls the delay of the gate and the attenuation of the driving current so as to contribute to the improvement in the performance of the circuit. Also, where the capacity of the memory cell array is increased, the lowered resistance in the control gate of the memory transistor 28 permits controlling the voltage drop caused by the resistance of the control gate. Also, since it is possible to suppress the delay in the response time, the number of divisions of the array can be decreased so as to markedly contribute to the miniaturization of the chip area. What should also be noted is that the controllability of the cell device can be improved by stabilizing the voltage of the control gate.

It should also be noted that the salicide film 27d is not formed on the source/drain diffusion layers 21 in the memory cell region. As a result, even in the case where both the electrode material layer formation and the device operation are to be satisfied, it is possible to avoid the problem that the degree of freedom in the element design of the memory cell is markedly limited.

Figure 3A:
Figure 3B:
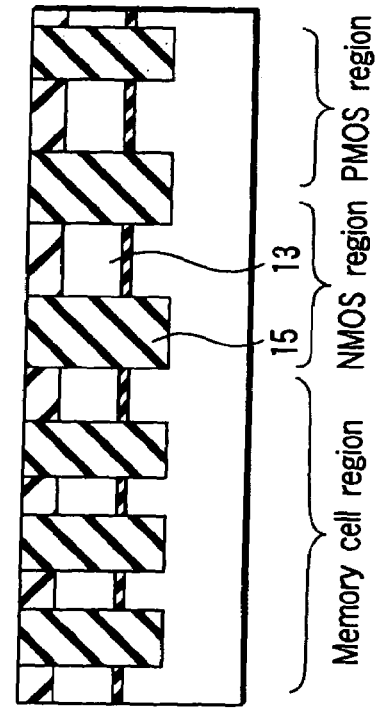

Further, the separation of the first electrode layer 13 is self-aligned with the formation of the element separating region shown in FIGS. 3A, 3B so as to make it possible to miniaturize the cell size.

Still further, the first embodiment of the present invention makes it possible to manufacture a NAND type flash memory by employing the salicide technology that is typically employed in many cases in the manufacture of a system LSI. In other words, the first embodiment of the present invention is highly effective for the manufacture of a mixed chip including a flash memory and a system LSI and requiring high performance and high functionality of the element such as high speed operability of the peripheral control circuit, low power consumption and low driving voltage.

What should also be noted is that, since the salicide film 27c is formed on the diffusion layers 24, 26 in the peripheral circuit region, it is possible to decrease the resistance of the contact connected to the diffusion layers 24, 26 without deteriorating the characteristics of the memory cell. It follows that it is possible to suppress the reduction in the drive current of the peripheral transistors 29, 30 that is caused by the voltage drop generated by the contact resistance.

Second Embodiment

The second embodiment is directed to an example that an insulating film having an open portion is formed in the clearance between the first and second conductive layers of the peripheral transistor included in the semiconductor memory device according to the first embodiment of the present invention described above.

Figures 15A, 15B:
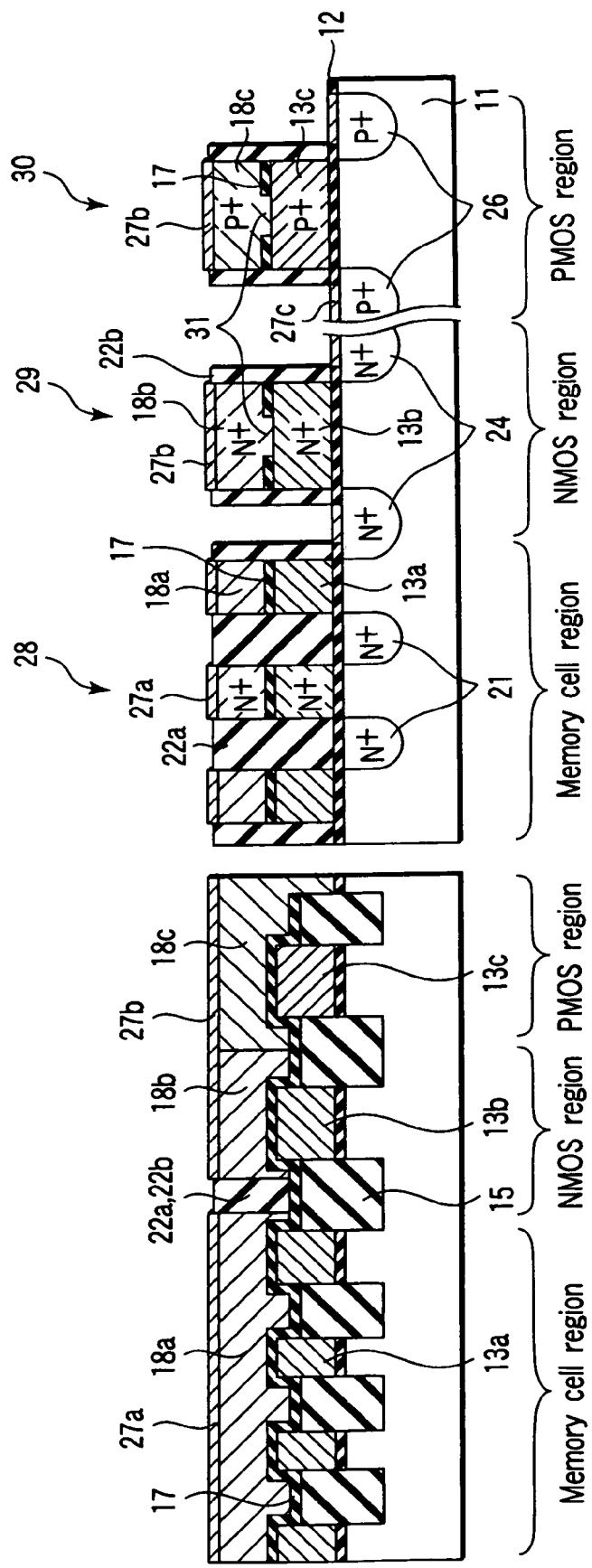
FIGS. 15A and 15B are cross sectional views collectively showing the construction of a semiconductor memory device according to a second embodiment of the present invention.

FIGS. 15A and 15B are cross sectional views collectively showing the construction of a semiconductor memory device according to the second embodiment of the present invention. As shown in FIGS. 15A, 15B, the semiconductor memory device according to the second embodiment differs from the semiconductor memory device according to the first embodiment in that, in the second embodiment, an insulating film 17 having an open portion is formed between the first conductive layer 13b and the second conductive layer 18b included in the peripheral transistor 29 and between the first conductive layer 13c and the second conductive layer 18c included in the peripheral transistor 30. The insulating film 17 is formed simultaneously with formation of the insulating film 17 formed between the first conductive layer 13a and the second conductive layer 18a included in the memory transistor 28. Also, the material of the insulating film 17 formed in each of the peripheral transistors 29, 30 is equal to that of the insulating film 17 formed in the memory transistor 28. It is desirable for the open portion 31 of the insulating film 17 to be arranged in the center between the first conductive layer 13b and the second conductive layer 18b and in the center between the first conductive layer 13c and the second conductive layer 18c. The open portions 31 of the insulating films 17 are intended to permit the first conductive layers 13b, 13c to be electrically connected to the second conductive layers 18b, 18c, respectively. Therefore, the number and shape of the open portions 31 are not particularly limited as far as the first conductive layers 13b, 13c are electrically connected to the second conductive layers 18b, 18c, respectively. It is also possible to form a plurality of open portions 31 in the insulating film 17.

FIGS. 16A, 16B to 21A, 21B are cross sectional views collectively showing the manufacturing process of the semiconductor memory device according to the second embodiment of the present invention. The manufacturing method of the semiconductor memory device according to the second embodiment of the present invention will now be described with reference to FIGS. 16A, 16B to 21A, 21B. Incidentally, in describing the manufacturing process of the semiconductor memory device according to the second embodiment of the present invention, the manufacturing steps similar to those in the manufacturing process of the semiconductor memory device according to the first embodiment will be described briefly such that an emphasis is placed on the manufacturing steps differing from those in the manufacturing process of the semiconductor memory device according to the first embodiment of the present invention.

In the first step, a first conductive layer 13a is formed in the memory cell region as in the first embodiment, as shown in FIGS. 2A, 2B to 5A, 5B.

In the next step, a third insulating film 17 consisting of, for example, an ONO film is deposited to cover the first electrode material layer 13, the first conductive layer 13a and the insulating film 15 for the element separation. Then, the third insulating film 17 in the peripheral circuit region is selectively removed so as to form the open portion 31.

After formation of the open portion 31, a second electrode material layer 18 is deposited so as to cover the third insulating film 17, the first electrode material layer 13, the first conductive layer 13a and the insulating film 15 for the element separation, as shown in FIGS. 17A and 17B. Incidentally, the second electrode material layer 18 is formed of polysilicon into which an impurity is not introduced.

In the next step, a resist layer 19 is formed on the second electrode material layer 18, followed by pattering the resist layer 19, as shown in FIGS. 18A and 18B. Then, the first and second electrode material layers 13, 18, the third insulating film 17 and the first conductive layer 13a are selectively removed by using the patterned resist layer 19 as a mask, thereby forming gate patterns of the memory transistor and the peripheral transistors.

In the next step, the resist layer 19 is removed, followed by a post-oxidation so as to form an oxide film (not shown) on the gate, as shown in FIGS. 19A, 19B. Then, a resist layer 20 is formed to cover the first insulating film 12 and the second electrode material layer 18, followed by patterning the resist layer 20, as shown in FIGS. 20A and 20B. Further, ion implantation is performed by using the patterned resist layer 20 as a mask so as to form $N^+$-type source/drain diffusion layers 21 in the memory cell region of the semiconductor substrate 11, followed by removing the resist layer 20.

After removal of the resist layer 20, a fourth insulating film 22 is formed to cover the first insulating film 12 and the second electrode material layer 18 in a manner to satisfy the relationship given by formula (1) referred previously, as shown in FIGS. 21A and 21B.

In the next step, the fourth insulating film 22 is etched back so as to expose the surfaces of the second electrode material layer 18 and the first insulating film 12 or the surfaces of the diffusion layer regions of the peripheral transistors, as shown in FIGS. 22A and 22B. As a result, a buried insulating film 22a is formed in the clearance between the gate electrodes in the memory cell region, and a side wall insulating film 22b is formed on the side surface of the gate electrode in the peripheral circuit region.

Then, a resist layer 23 is formed to cover the first insulating film 12 and the second electrode material layer 18, followed by patterning the resist layer 23, as shown in FIGS. 23A and 23B. Further, ion implantation is performed by using, for example, arsenic (As) ions as an impurity, with the patterned resist layer 23 used as a mask, followed by applying annealing to the ion-implanted regions. As a result, the introduced impurity is diffused so as to form a second conductive layer 18a in the memory cell region and to form the first and second conductive layers 13b, 18b, and the $N^+$-type source/drain diffusion layers 24 in the NMOS region. It should be noted that the impurity introduced into the second electrode material layer 18 of the NMOS region is diffused through the open portion 31 of the third insulating film 17 into the first electrode material 13 of the NMOS region so as to form the first conductive layer 13b in the NMOS region. Then, the resist layer 23 is removed.

After removal of the resist layer 23, a resist layer 25 is formed to cover the first insulating film 12 and the second electrode material layer 19, followed by patterning the resist layer 25, as shown in FIGS. 24A and 24B. Then, ion implantation is performed by using, for example, boron (B) as an impurity, with the patterned resist layer 25 used as a mask. The introduced impurity is diffused by annealing so as to form the first and second conductive layers 13c, 18c and the $P^+$-type source/drain diffusion layers 26 in the PMOS region. It should be noted that the impurity introduced into the second electrode material layer 18 of the PMOS region is diffused through the open portion 31 of the third insulating film 17 into the first electrode material layer 13 of the PMOS region so as to form the first conductive layer 13c of the PMOS region. Then, the resist layer 25 is removed.

In the next step, the salicide films 27a, 27b, 27c are formed to cover the second conductive layer 18a in the memory cell region, the second conductive layers 18b, 18c in the peripheral circuit region, and the source/drain diffusion layers 24, 26 of the peripheral circuit region, respectively, as shown in FIGS. 15A and 15B.

The second embodiment of the present invention described above permits producing effects similar to those produced by the first embodiment described previously.

It should be noted that, in the second embodiment of the present invention, the third insulating films 17 each having the open portion 31 are formed between the first conductive layer 13b and the second conductive layer 18b in the peripheral transistor 29 and between the first conductive layer 13c and the second conductive layer 18c in the peripheral transistor 30. It follows that the edge portion of the gate electrode in the NMOS region is of a three-layer structure including the first conductive layer 13b, the second conductive layer 18b and the third insulating film 17 interposed between the first and second conductive layers 13b and 18b. Likewise, the edge portion of the gate electrode in the PMOS region is of a three-layer structure including the first conductive layer 13c, the second conductive layer 18c and the third insulating film 17 interposed between the first and second conductive layers 13c and 18c. On the other hand, the gate electrode in the memory cell transistor is of a three-layer structure including the first conductive layer 13a, the second conductive layer 18a and the third insulating film 17 interposed between the first and second conductive layers 13a and 18a. It follows that, concerning the edge portion of the gate electrode to which is applied the gate processing, the peripheral transistors 29, 30 and the memory transistor 28 are equal to each other in the laminate structure of the gate. It follows that the gate processing can be applied simultaneously to the memory transistor 28 and the peripheral transistors 29, 30 without changing the etching conditions.

Third Embodiment

The third embodiment, which is equal in construction to the second embodiment described above, differs from the second embodiment in that, in the third embodiment, the first electrode material in the memory transistor and the first electrode material in the peripheral transistor, which is equal in the conductivity type to the memory transistor, are rendered conductive simultaneously.

FIGS. 25A, 25B to 35A, 35B are cross sectional views collectively showing the manufacturing process of a semiconductor memory device according to a third embodiment of the present invention. The manufacturing method of the semiconductor memory device according to the third embodiment of the present invention will now be described with reference to FIGS. 25A, 25B to 35A, 35B. In describing the manufacturing process of the semiconductor memory device according to the third embodiment of the present invention, the manufacturing steps equal to those in the manufacturing process of the semiconductor memory device according to the first and second embodiments of the present invention will be omitted, and the manufacturing steps differing from those in the first and second embodiments will be described.

In the first step, a first electrode material layer 13 is formed on a first insulating film 12, followed by forming an insulating film 15 for the element separation as shown in FIGS. 2A, 2B to 4A, 4B, as in the first embodiment.

In the next step, a resist layer 16a is formed on the first electrode material layer 13, followed by patterning the resist layer 16a such that the resist layer 16a is left unremoved on the PMOS region alone, as shown in FIGS. 25A and 25B. Then, ion implantation is performed for implanting impurity ions into the first electrode material layer 13 in the memory cell region and the NMOS region by using the patterned resist layer 16a as a mask, followed by applying annealing to the first electrode material layer 13 so as to form first conductive layers 13a, 13b. In this case, the ion implantation is carried out by using, for example, phosphorus (P) as an impurity under the conditions that the accelerating energy is set at scores of KeV and the dose of the impurity is set at about $10^{15}$ cm$^{-2}$. Incidentally, the reference numeral 13a shown in FIGS. 25A, 25B denotes the first conductive layer in the memory cell region, and the reference numeral 13b shown in FIGS. 25A, 25B denotes the first conductive layer in the NMOS region. Then, the resist layer 16a is removed.

In the next step, a resist layer 16b is formed to cover the first electrode material layer 13 and the first conductive layers 13a, 13b, followed by patterning the resist layer 16b such that the resist layer 16b is left unremoved on only the memory cell region and the NMOS region. Then, impurity ions are introduced into the first electrode material layer 13 of the PMOS region by ion implantation with the patterned resist layer 16b used as a mask, followed by applying annealing to the first electrode material layer 13 so as to form a first conductive layer 13c. In this ion implantation treatment, boron (B), for example, is used as a P-type impurity, and the ion implantation is carried out under the conditions that the accelerating energy is set at scores of KeV and the dose of the impurity is set at about $10^{15}$ cm$^{-2}$. Then, the resist layer 16b is removed.

After removal of the resist layer 16b, a third insulating film 17 consisting of, for example, an ONO film is deposited to cover the first conductive layers 13a, 13b, 13c and the insulating film 15 for the element separation, as shown in FIGS. 27A and 27B. Then, the third insulating film 17 in the peripheral circuit region is selectively removed so as to form an open portion 31.

In the next step, a second electrode material layer 18 is deposited in a manner to cover the third insulating film 17, the first conductive layers 13b, 13c and the insulating film 15 for the element separation, as shown in FIGS. 28A and 28B. The second electrode material layer 18 is formed of polysilicon into which an impurity is not introduced.

Then, a resist layer 19 is formed on the second electrode material layer 18, followed by patterning the resist layer 18, as shown in FIGS. 29A, 29B. Further, the second electrode material layer 18, the third insulating film 17 and the first conductive layers 13a, 13b, 13c are selectively removed by using the patterned resist layer 19 as a mask, thereby forming gate patterns for the memory transistor and the peripheral transistors.

In the next step, the patterned resist layer 19 is removed as shown in FIGS. 30A and 30B, followed by applying a post-oxidation so as to form an oxide film (not shown) on the gate. Then, a resist layer 20 is formed in a manner to cover the first insulating film 12 and the second electrode material layer 18, followed by patterning the resist layer 20, as shown in FIGS. 31A and 31B. Further, ion implantation is carried out by using the patterned resist layer 20 as a mask so as to form N$^+$-type source/drain diffusion layers 21 in the semiconductor substrate 11 in the memory cell region, followed by removing the patterned resist layer 20.

In the next step, a fourth insulating film 22 is formed to cover the first insulating film 12 and the second electrode material layer 18 in a manner to satisfy the relationship given by formula (1) referred to previously. Then, the fourth insulating film 22 is etched back so as to expose the surfaces of the second electrode material layer 18 and the first insulating film 12 or the surface of the diffusion layer region of the peripheral transistor to the outside, as shown in FIGS. 33A and 33B. As a result, a buried insulating film 22a is formed in the clearance between the gate electrodes in the memory cell region, and a side wall insulating film 22b is formed on the side surface of the gate electrode in the peripheral circuit region.

In the next step, a resist layer 23 is formed to cover the first insulating film 12 and the second electrode material layer 18, followed by patterning the resist layer 23 such that the resist layer 23 is left unremoved on the PMOS region, as shown in FIGS. 34A and 34B. Then, an impurity of, for example, arsenic (As) is introduced into the second electrode material layer 18 by means of ion implantation with the patterned resist film 23 used as a mask, followed by applying annealing to the introduced impurity so as to diffuse the impurity. As a result, a second conductive layer 18*a* is formed in the memory cell region, and a second conductive layer 18*b* and $N^+$-type source/drain diffusion layers 24 are formed in the NMOS region. Then, the patterned resist layer 23 is removed.

After removal of the patterned resist layer 23, a resist layer 25 is formed to cover the first insulating film 12 and the second electrode material layer 18, followed by patterning the resist layer 25 such that the resist layer 25 is left unremoved on the memory cell region and the NMOS region, as shown in FIGS. 35A and 35B. Then, ion implantation using, for example, boron (B) as an impurity is performed by using the patterned resist layer 25 as a mask, followed by applying annealing to the introduced impurity so as to diffuse the impurity. As a result, a second conductive layer 18*c* and $P^+$-type source/drain diffusion layers 26 are formed in the PMOS region. Then, the patterned resist layer 25 is removed.

After removal of the patterned resist layer 25, the salicide films 27*a*, 27*b*, 27*c* are formed on the second conductive layer 18*a* in the memory cell region, on the second conductive layers 18*b*, 18*c* in the peripheral circuit region, and on the source/drain diffusion layers 24, 26 in the peripheral circuit region, respectively, as in the second embodiment described previously.

According to the third embodiment of the present invention described above, it is possible to obtain effects similar to those obtained in the first and second embodiments described previously.

Further, the first electrode material layers 13 in the memory transistor 28 and the peripheral transistor 29 are simultaneously rendered conductive. It follows that the number of manufacturing process steps can be decreased, and the semiconductor memory device can be manufactured easily.

Incidentally, where the memory transistor 28 is of P-type, it is desirable to render conductive the first electrode material layer 13 in the memory cell region simultaneously in the step of rendering conductive the first electrode material layer 13 in the PMOS region.

Fourth Embodiment

The fourth embodiment, which is equal in construction to the third embodiment described above, differs from the third embodiment in that, in the fourth embodiment, a conductive material is used in forming first the first electrode material layer.

FIGS. 36A, 36B to 39A, 39B are cross sectional views collectively showing the manufacturing process of a semiconductor memory device according to the fourth embodiment of the present invention. The manufacturing method of the semiconductor memory device according to the fourth embodiment of the present invention will now be described with reference of FIGS. 36A, 36B to 39A, 39B. In describing the manufacturing process of the semiconductor memory device according to the fourth embodiment of the present invention, the manufacturing steps equal to those in the manufacturing process of the semiconductor memory device according to the third embodiment of the present invention will be omitted, and the manufacturing steps differing from those in the third embodiment will be described.

Figure 36A:
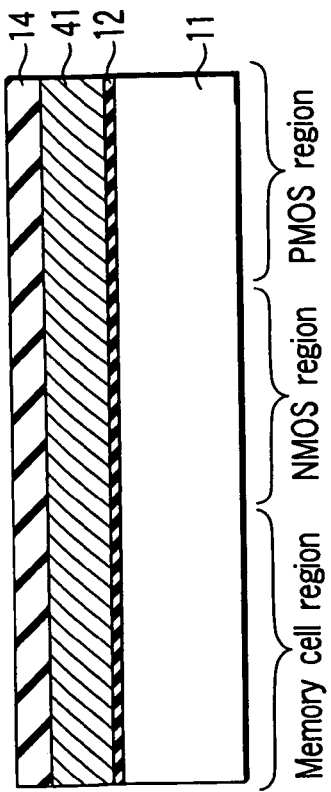
FIGS. 36A, 36B, 37A, 37B, 38A, 38B, 39A and 39B are cross sectional views collectively showing the process of manufacturing a semiconductor memory device according to a fourth embodiment of the present invention.
Figure 36B:
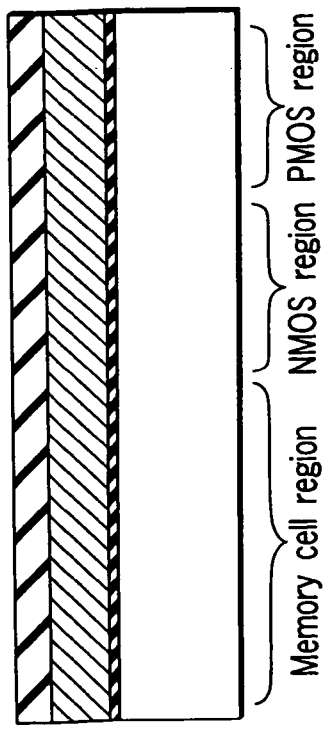

In the first step, a first insulating film 12 forming a gate insulating film is formed on a semiconductor substrate 11, as shown in FIGS. 36A and 36B. Then, an $N^+$-type first conductive layer 41 into which an impurity has been introduced is formed on the first insulating film 12, followed by depositing a second insulating film 14 consisting of silicon nitride on the first conductive layer 41.

Figure 37A:
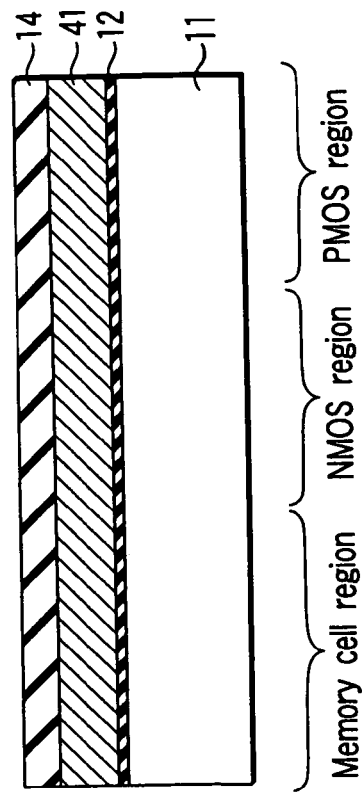
Figure 37B:
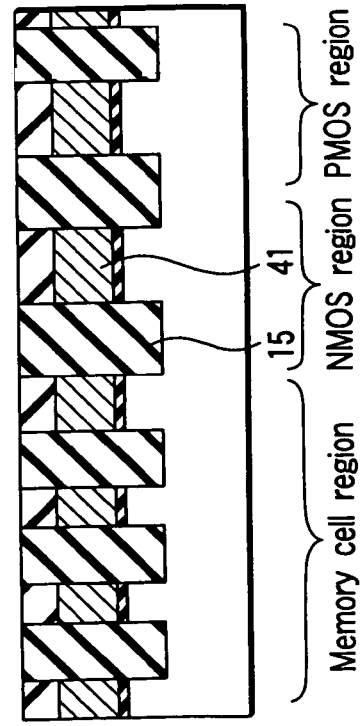

In the next step, the second insulating film 14, the first conductive layer 41, the first insulating film 12 and the semiconductor substrate 11 are selectively removed so as to form a groove for the element separation, as shown in FIGS. 37A and 37B. Then, an insulating film 15 for the element separation consisting of a silicon oxide film is deposited to fill the groove for the element separation, followed by planarizing the insulating film 15 for the element separation until the surface of the second insulating film 14 is exposed to the outside, thereby forming an element separating region of an STI structure consisting of the insulating film 15 for the element separation.

Figure 38A:
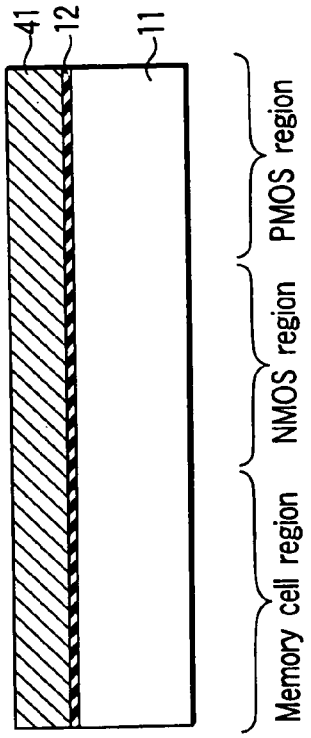
Figure 38B:
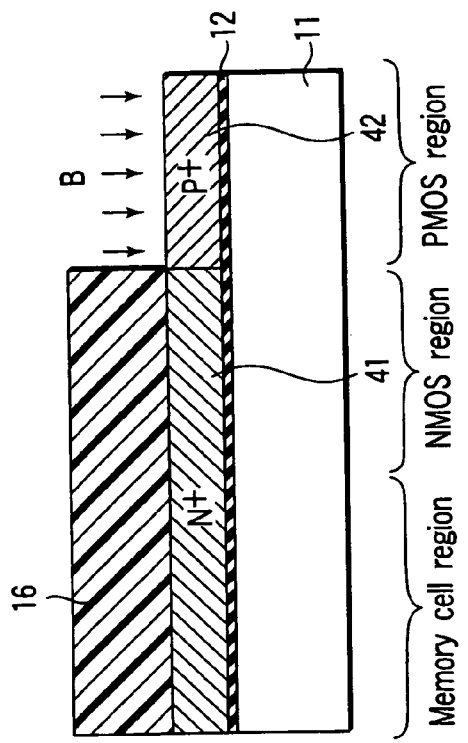
Figure 39A:
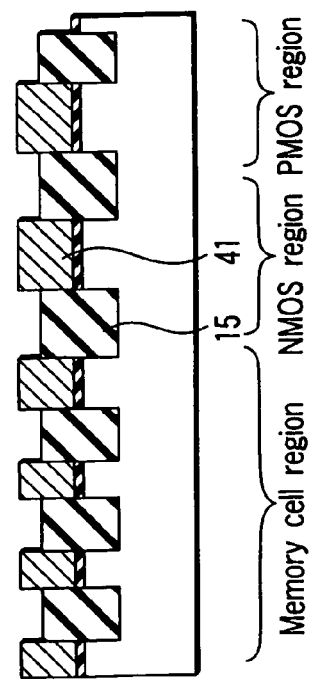
Figure 39B:
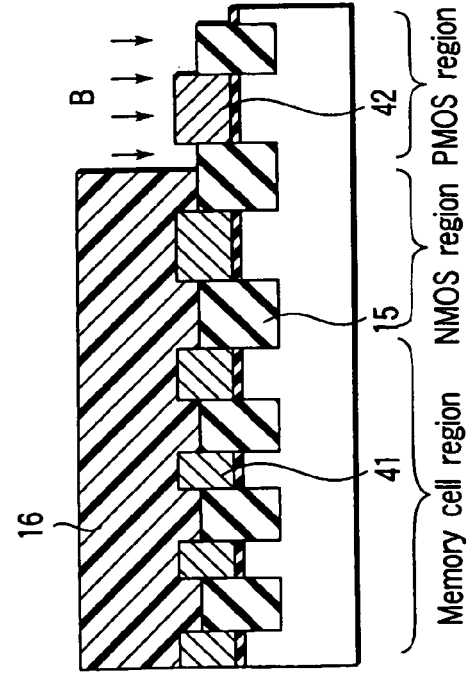

In the next step, the element separation insulating film 15 is partly etched so as to permit the surface of the element separating insulating film 15 to be positioned lower than the surface of the first conductive layer 41, followed by peeling off the second insulating film 14, as shown in FIGS. 38A and 38B. Then, a resist layer 16 is formed on the first conductive layer 41, followed by patterning the resist layer 16 such that the resist layer 16 is left unremoved on only the memory cell region and the NMOS region. Further, ion implantation is applied to the first conductive layer 41 in the PMOS region with the patterned resist 16 used as a mask, followed by applying annealing so as to form a $P^+$-type first conductive layer 42. In carrying out the ion implantation, boron (B), for example, is used as a P-type impurity, and the ion implantation is carried out under the conditions that the accelerating energy is set at scores of KeV and the dose of the impurity is set at about $10^{15}$ cm$^{-2}$. The dose of the impurity in the process step shown in FIGS. 39A, 39B is about twice as high as the dose of the impurity in the first conductive layer 41. Then, the patterned resist layer 16 is removed.

Then, the process steps shown in FIGS. 27A, 27B to 35A, 35B are carried out as in the third embodiment so as to manufacture a semiconductor memory device as shown in FIGS. 15A and 15B.

According to the fourth embodiment of the present invention described above, it is possible to obtain effects similar to those obtained in each of the first and second embodiments described previously.

Further, it is possible to omit the process step for making conductive the first electrode material layer 13 in the memory cell region and the NMOS region. It follows that it is possible to decrease the number of manufacturing process steps and to manufacture easily the semiconductor memory device.

Fifth Embodiment

The fifth embodiment is directed to an example of a semiconductor memory device in which a selecting transistor controlling a memory transistor is arranged in the vicinity of the memory transistor.

Figure 40:
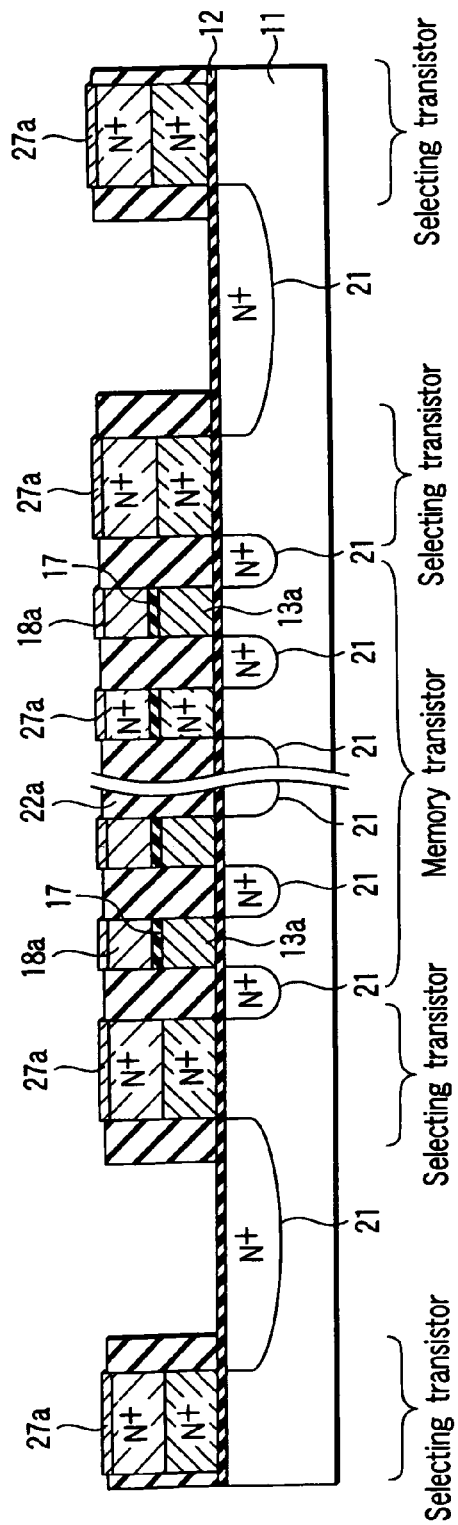
FIG. 40 is cross sectional view collectively showing the construction of a semiconductor memory device according to a fifth embodiment of the present invention.
Figure 41:
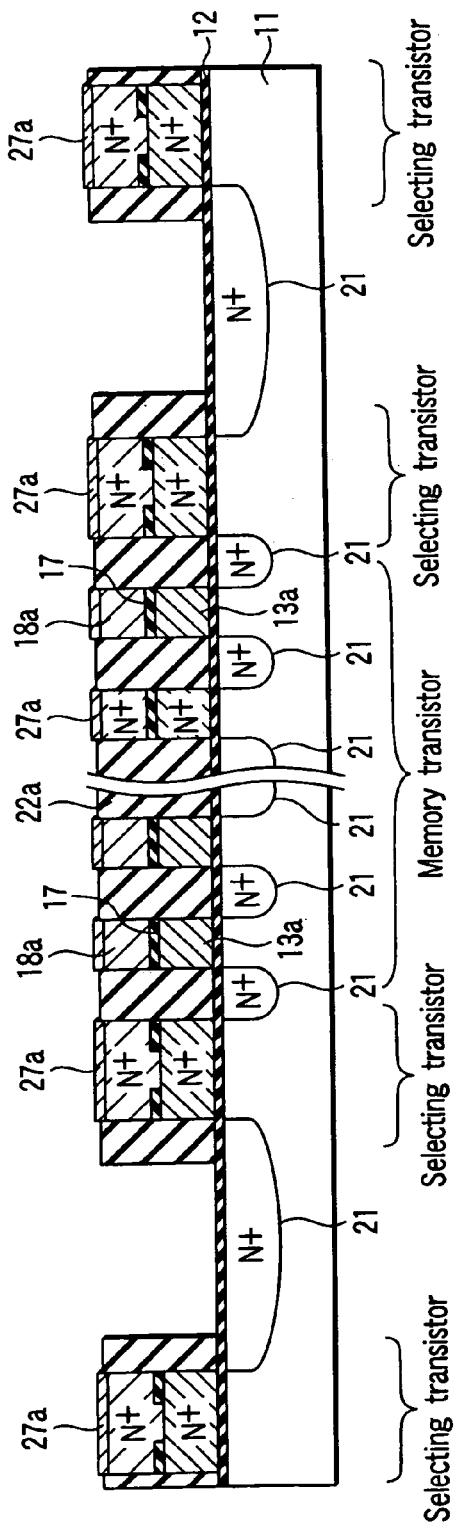
FIG. 41 is cross sectional view collectively showing the construction of another semiconductor memory device according to the fifth embodiment of the present invention.

FIGS. 40A, 40B, 41A and 41B are cross sectional views each showing the construction of a semiconductor memory device according to the fifth embodiment of the present invention. To be more specific, FIGS. 40A, 40B shows the construction in the case where an insulating film is not formed in the clearance between the first and second conductive layers of the selecting transistor. On the other hand, FIGS. 41A, 41B shows the construction in the case where an insulating film having an open portion is formed in the clearance between the first and second conductive layers of the selecting transistor. The semiconductor memory device according to the fifth embodiment will now be described with reference to FIGS.

40A, 40B, 41A and 41B. Concerning the semiconductor memory device according to the fifth embodiment, the description of the construction similar to that of the semiconductor memory device according to any of the first to fourth embodiments described above is omitted and the differing construction alone will be described.

As shown in FIGS. 40A, 40B, 41A and 41B, a selecting transistor is arranged in the vicinity of the memory transistor in the semiconductor memory device according to the fifth embodiment of the present invention. In each of the memory transistor and the selecting transistor, an insulating film 22a is formed between the adjacent gates so as to cover the surface of a diffusion layer 21. Therefore, a salicide film 27a is formed on each of the gates. However, a salicide film is not formed on the diffusion layer 21. Also, it is desirable for the gate of the memory transistor and the gate of the selecting transistor to be arranged apart from each other by the first distance X referred to previously.

According to the fifth embodiment, it is possible to obtain effects similar to those obtained in each of the first and second embodiments.

Sixth Embodiment

The sixth embodiment is directed to an example that, in forming a PMOS transistor comprising a P-type first conductive layer and an N-type second conductive layer, an electrode material into which an impurity is not injected is used for forming the first conductive layer.

Figure 42:
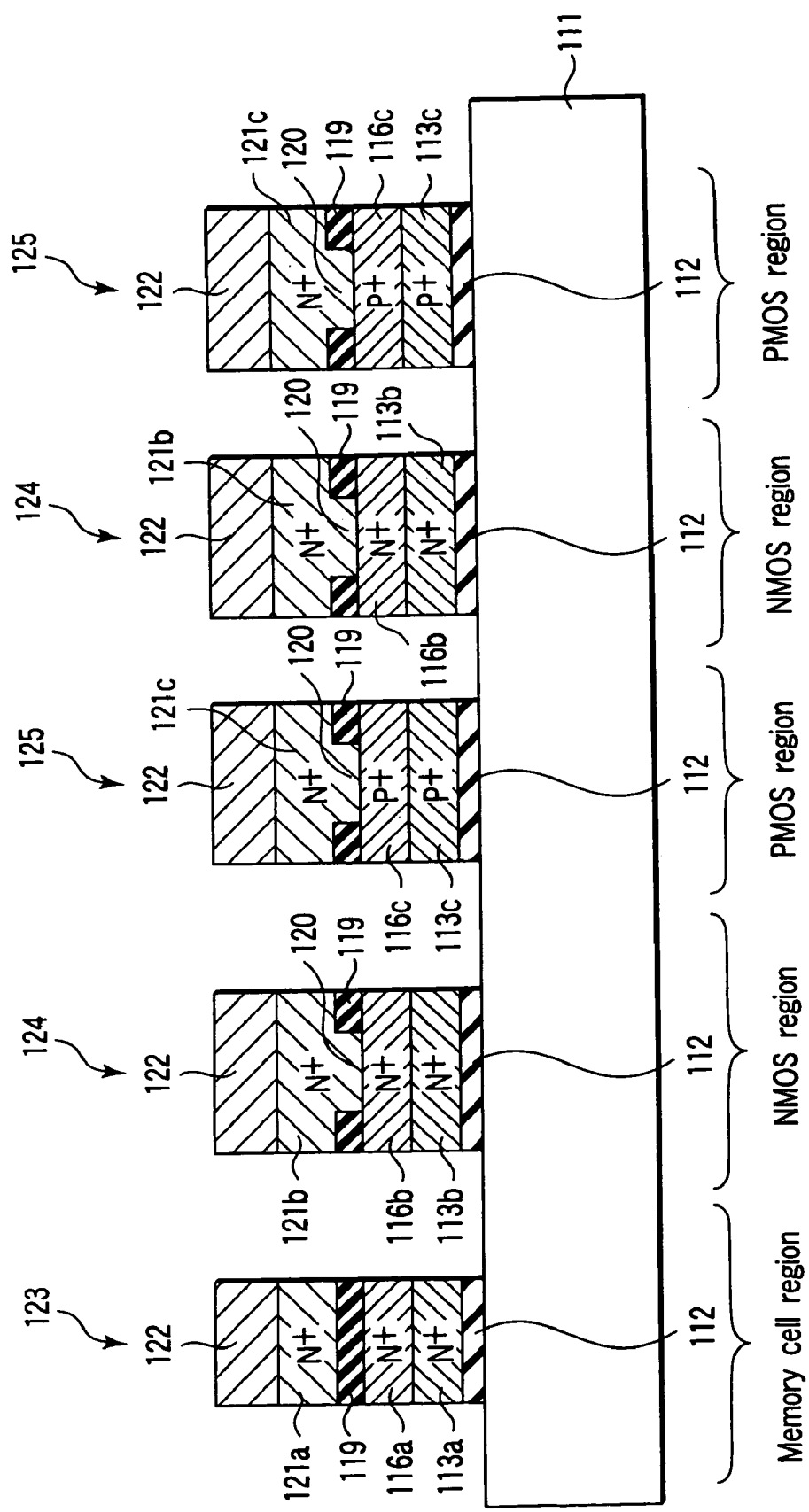
FIG. 42 is a cross sectional view showing the construction of a semiconductor memory device according to a sixth embodiment of the present invention in a direction perpendicular to the element separating region.
Figure 43:
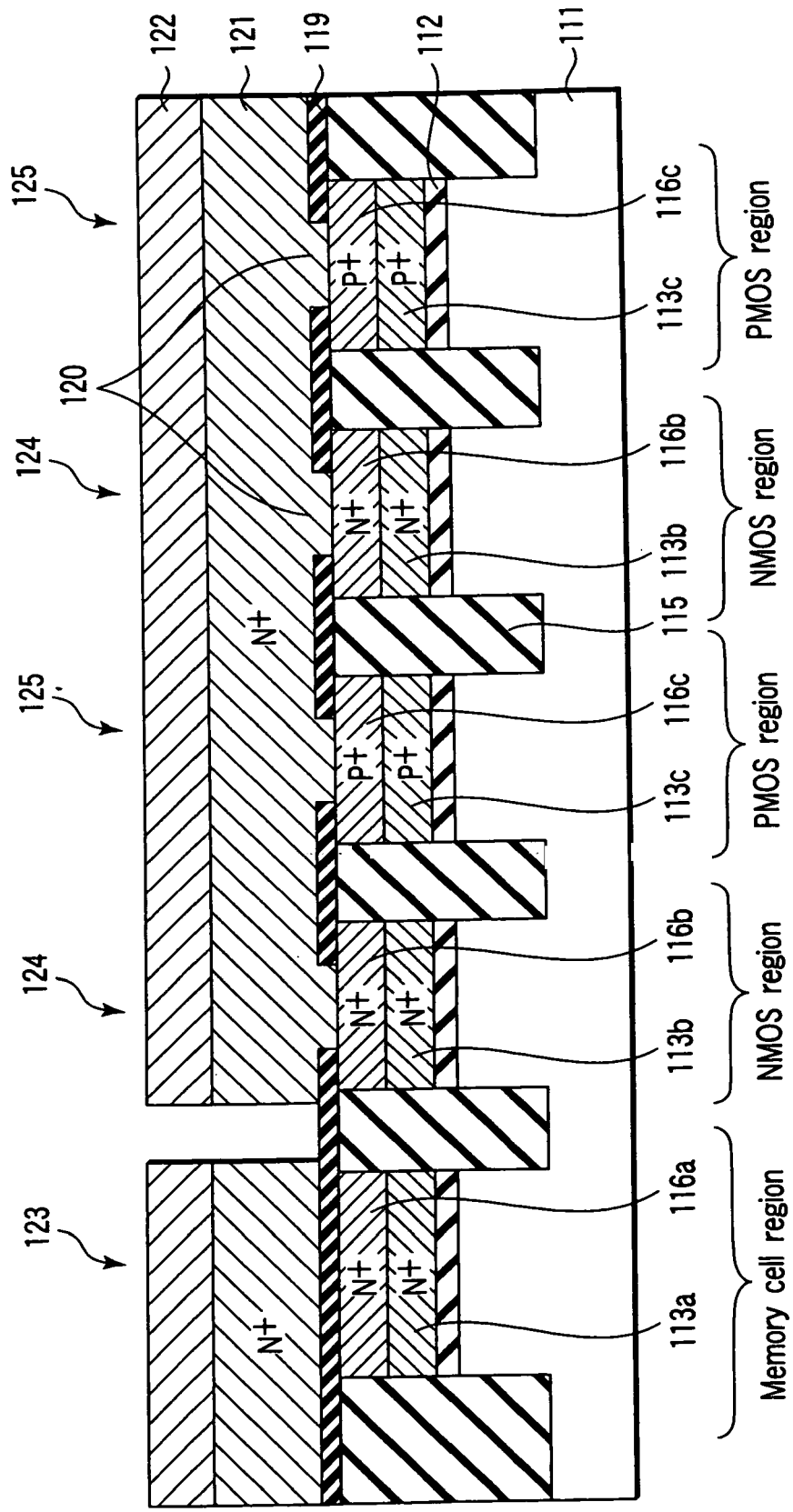
FIG. 43 is a cross sectional view showing the construction of a semiconductor memory device according to the sixth embodiment of the present invention in a direction perpendicular to the gate electrode.

FIGS. 42 and 43 are cross sectional views collectively showing a semiconductor memory device according to the sixth embodiment of the present invention. Specifically, FIG. 42 is a cross sectional view perpendicular to the element separating region of the memory cell region. On the other hand, FIG. 43 is a cross sectional view perpendicular to the gate electrode of the memory cell region.

As shown in FIG. 42, the semiconductor memory device according to the sixth embodiment comprises a memory cell region and a peripheral circuit region including an NMOS region and a PMOS region. A PMOS transistor 125 in the PMOS region includes P$^+$-type first and second conductive layers 113c, 116c formed on a semiconductor substrate 111, an insulating film 119 having an open portion 120 and formed on the second conductive layer 116c, and an N$^+$-type third conductive layer 121c formed on the insulating film 119 and the second conductive layer 116c. On the other hand, an NMOS transistor 124 in the NMOS region includes N$^+$-type first and second conductive layers 113b, 116b formed on the semiconductor substrate 111, an insulating film 119 having an open portion 120 and formed on the second conductive layer 116b, and an N$^+$-type third conductive layer 121b formed on the insulating film 119 and the second conductive layer 116b. Further, a memory transistor 123 in the memory region includes N$^+$-type first and second conductive layers 113a, 116a formed on the semiconductor substrate 111, an insulating film 119 formed on the second conductive layer 116a, and an N$^+$-type third conductive layer 121a formed on the insulating film 119.

In the peripheral circuit region described above, it suffices for the insulating film 119 to be present in only the edge portions between the second conductive layer 116b and the third conductive layer 121b and between the second conductive layer 116c and the third conductive layer 121c. Therefore, it is desirable for the open portion 120 of the insulating film 119 to be positioned in the centers between the second conductive layer 116b and the third conductive layer 121b and between the second conductive layer 116c and the third conductive layer 121c. Also, the open portion 120 of the insulating film 119 is intended to permit the first and second conductive layers 113b, 116b to be electrically connected to the third conductive layer 121b, and to permit the first and second conductive layers 113c, 116c to be electrically connected to the third conductive layer 121c. Therefore, the number of the open portions 120 and the shape of the open portion 120 are not particularly limited as far as the first conductive layers 113b, 113c and the second conductive layers 116b, 116b can be electrically connected to the third conductive layers 121b, 121c, respectively. Also, it is possible to form a plurality of open portions 120. Further, it is possible to remove all the insulating films 119 in the peripheral circuit region.

In the memory cell region noted above, the first and second conductive layers 113a, 116a perform the function of a floating gate of the memory transistor 123, and the third conductive layer 121a performs the function of a control gate of the memory transistor 123.

In general, a PMOS transistor includes a P-type conductive layer. However, the third conductive layer 121c of the PMOS transistor 125 according to the sixth embodiment of the present invention is formed of an N$^+$-type conductive layer. Therefore, in order to allow the third conductive layer 121c to perform sufficiently the function of the gate of the PMOS transistor 125, it is desirable for each of the first to third conductive layers 113a, 113b, 113c, 116a, 116b, 116c, 121a, 121b and 121b to have an impurity concentration not lower than $1\times10^{18}$ cm$^{-3}$.

In the semiconductor memory device according to the sixth embodiment of the present invention, it is possible for the third conductive layers 121b, 121c in the NMOS region and the PMOS region to be of the same conductivity type (N$^+$), as shown in FIG. 42. Therefore, the third conductive layer 121b of the NMOS transistor 124 need not be separated from the third conductive layer 121c of the PMOS transistor 125 on the element separating insulating film 115. In other words, the third conductive layer 121b and the third conductive layer 121c are formed contiguous on the element separating insulating film 115.

FIGS. 44 to 51 are cross sectional views collectively showing the manufacturing process of the semiconductor memory device according to the sixth embodiment of the present invention. The manufacturing process of the semiconductor memory device according to the sixth embodiment will now be described with reference to FIGS. 44 to 51.

Figure 44:
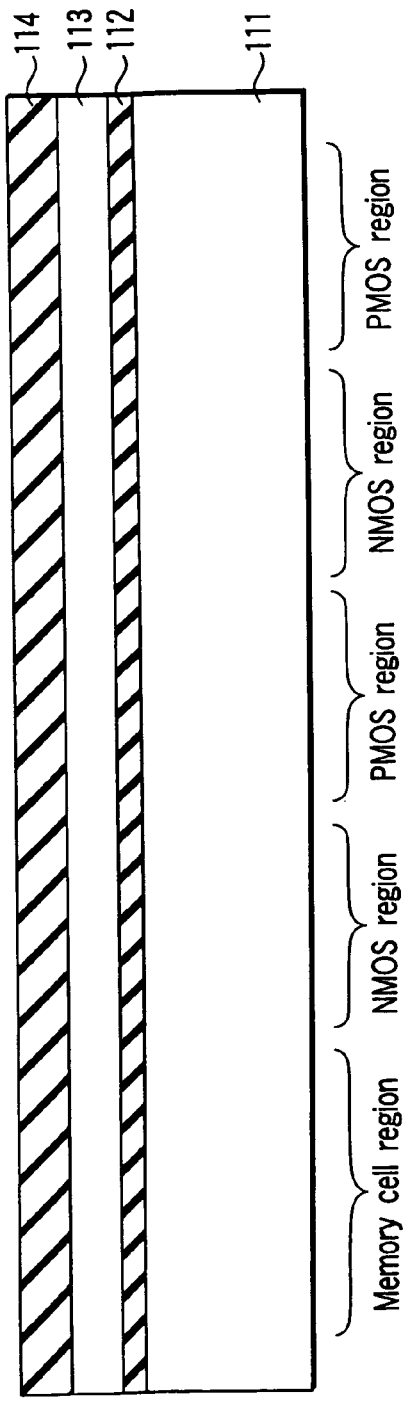
FIGS. 44, 45, 46, 47, 48, 49, 50 and 51 are cross sectional views collectively showing the manufacturing process of a semiconductor memory device according to the sixth embodiment of the present invention.

In the first step, a first insulating film 112 forming a gate insulating film is formed on a semiconductor substrate 111, followed by forming a first electrode material layer 113 on the first insulating film 112, as shown in FIG. 44. The first electrode material layer 113 is formed of polysilicon into which an impurity is not introduced. Then, a second insulating film 114 such as a silicon nitride film is deposited on the first electrode material layer 113.

Figure 45:
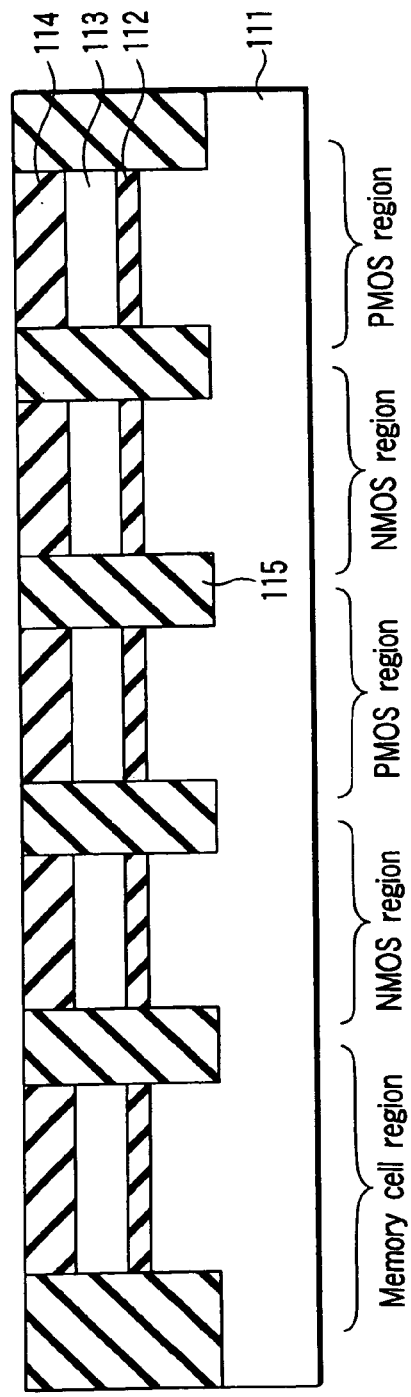
Figure 46:
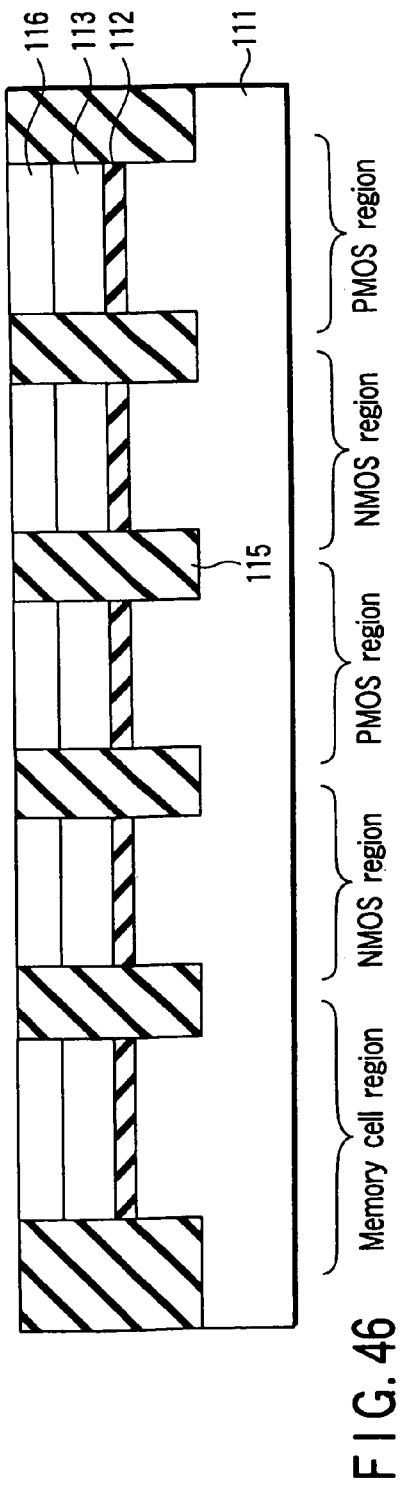

In the next step, the second insulating film 114, the first electrode material layer 113, the first insulating film 112 and the semiconductor substrate 111 are selectively removed so as to form a groove for the element separation, as shown in FIG. 45. Then, an element separating insulating film 115 such as an oxide film is deposited within the element separating groove, followed by planarizing the element separating insulating film 115 until the surface of the second insulating film 114 is exposed to the outside. In other words, the second insulating film 114 performs the function of a stopper film in planarizing the element separating insulating film 115. As a result, an element separating region of an STI (Shallow Trench Isolation) structure consisting of the element separating insulating film 115 is formed. Then, the second insulating film 114 is peeled off.

In the next step, a second electrode material layer 116 consisting of polysilicon into which an impurity is not injected is formed to cover the first electrode material layer 113 and the element separating insulating film 115, followed by removing the second electrode material layer 116 until the surface of the element separating insulating film 115 is exposed to the outside.

Figure 47:
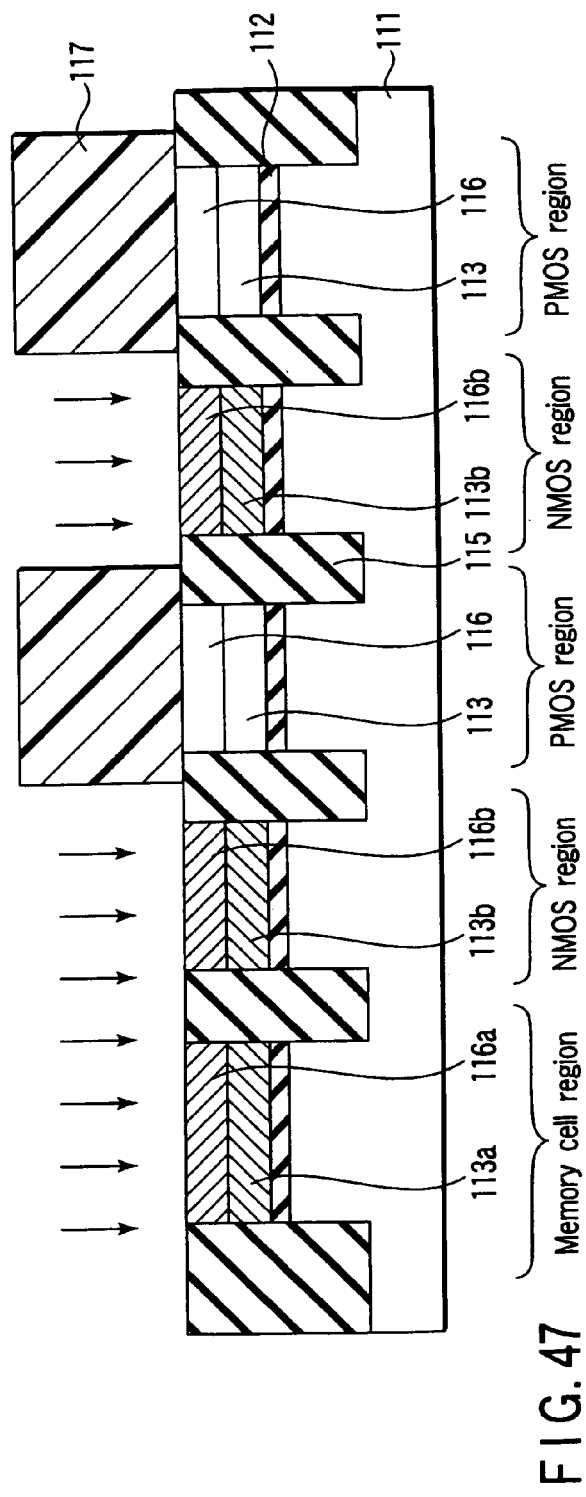

In the next step, a resist layer 117 is formed to cover the second electrode material layer 116 and the element separating insulating film 115, followed by patterning the resist layer 117 such that the resist layer 117 is left unremoved on the PMOS regions alone, as shown in FIG. 47. Then, ion implantation is applied to the second electrode material layer 116 in the memory cell region and the NMOS region by using the patterned resist layer 117 as a mask. In this ion implantation step, arsenic (As) or phosphorus (P) is used as an N-type impurity. Further, annealing is applied so as to allow the impurity implanted into the second electrode material layer 116 to be diffused into the first electrode material layer 113, thereby forming $N^+$-type first conductive layers 113a, 113b and second conductive layers 116a, 116b. Then, the patterned resist layer 117 is removed.

Figure 48:
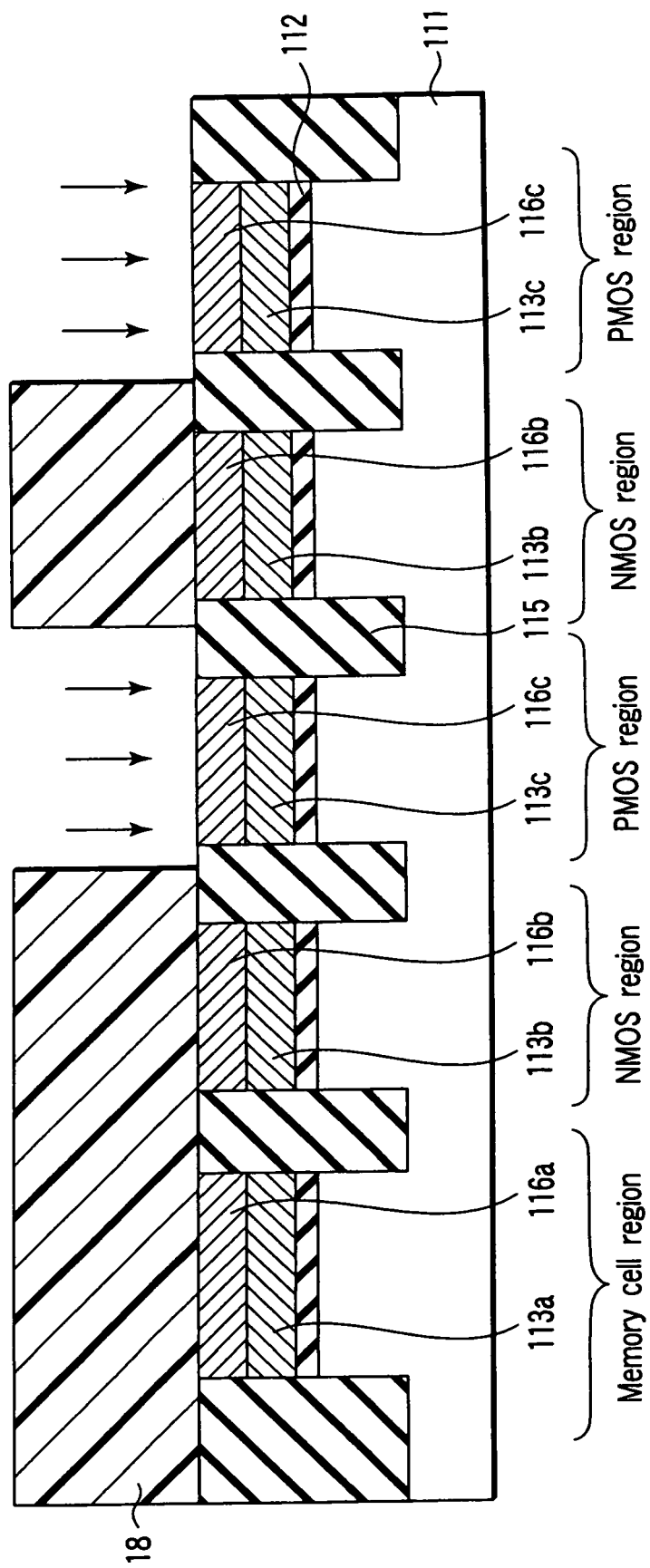

After removal of the patterned resist layer 117, a resist layer 118 is formed to cover the second conductive layers 116a, 116b and the element separating insulating film 115, followed by patterning the resist layer 118 such that the patterned resist layer 118 is left unremoved on only the memory cell region and the NMOS regions, as shown in FIG. 48. Then, ion implantation is applied to the second electrode material layer 116 in the PMOS region by using the patterned resist layer 118 as a mask. In this ion implantation step, boron (B), for example, is used as a P-type impurity. Then, annealing is applied so as to allow the impurity implanted into the second electrode material layer 116 to be diffused into the first electrode material layer 113, thereby forming $P^+$-type first conductive layer 113c and second conductive layer 116c. Then, the patterned resist layer 118 is removed.

Figure 49:
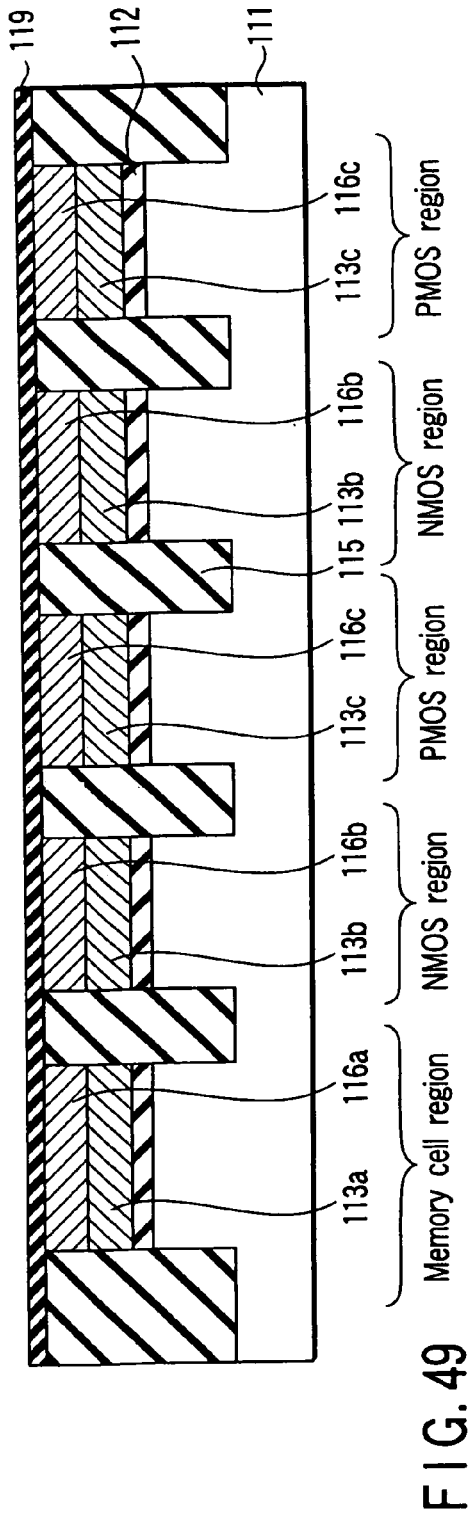
Figure 50:
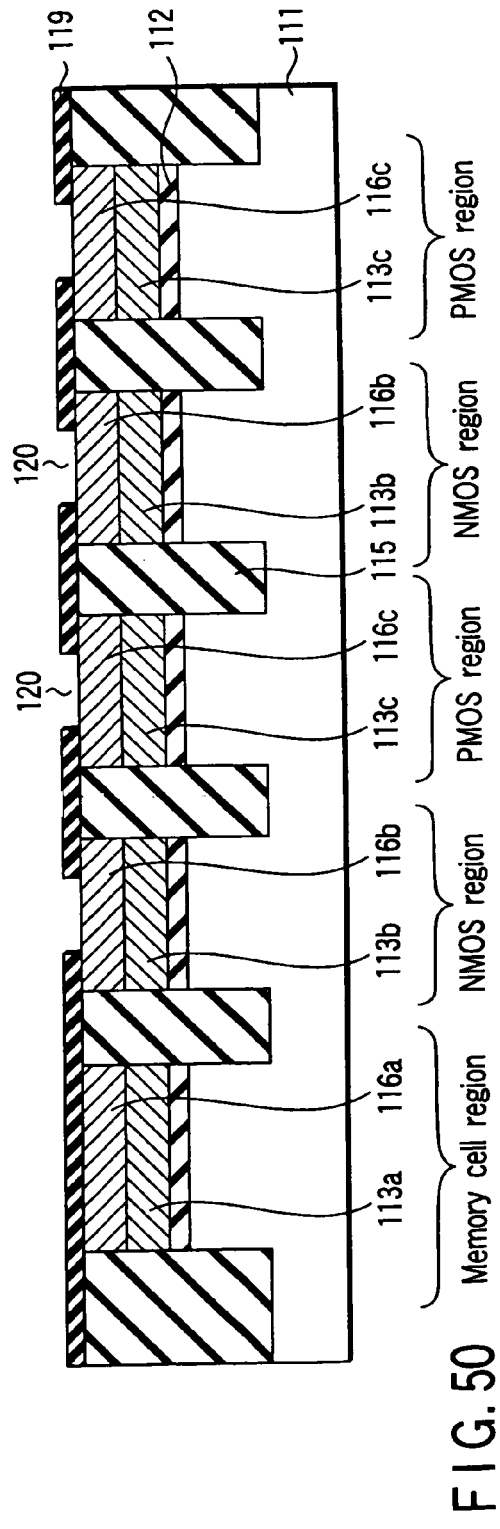

After removal of the patterned resist layer 118, a third insulating film 119 is deposited to cover the second conductive layers 116a, 116b, 116c and the element separating insulating film 115, as shown in FIG. 49. Then, the third insulating film 119 in the peripheral circuit region is partly removed so as to form an open portion 120, as shown in FIG. 50. Incidentally, it is possible to remove entirely the third insulating film 119 in the peripheral circuit region in this step. However, it is desirable to form the open portion 120 so as to permit the third insulating film 119 to remain in the peripheral circuit region, too.

Figure 51:
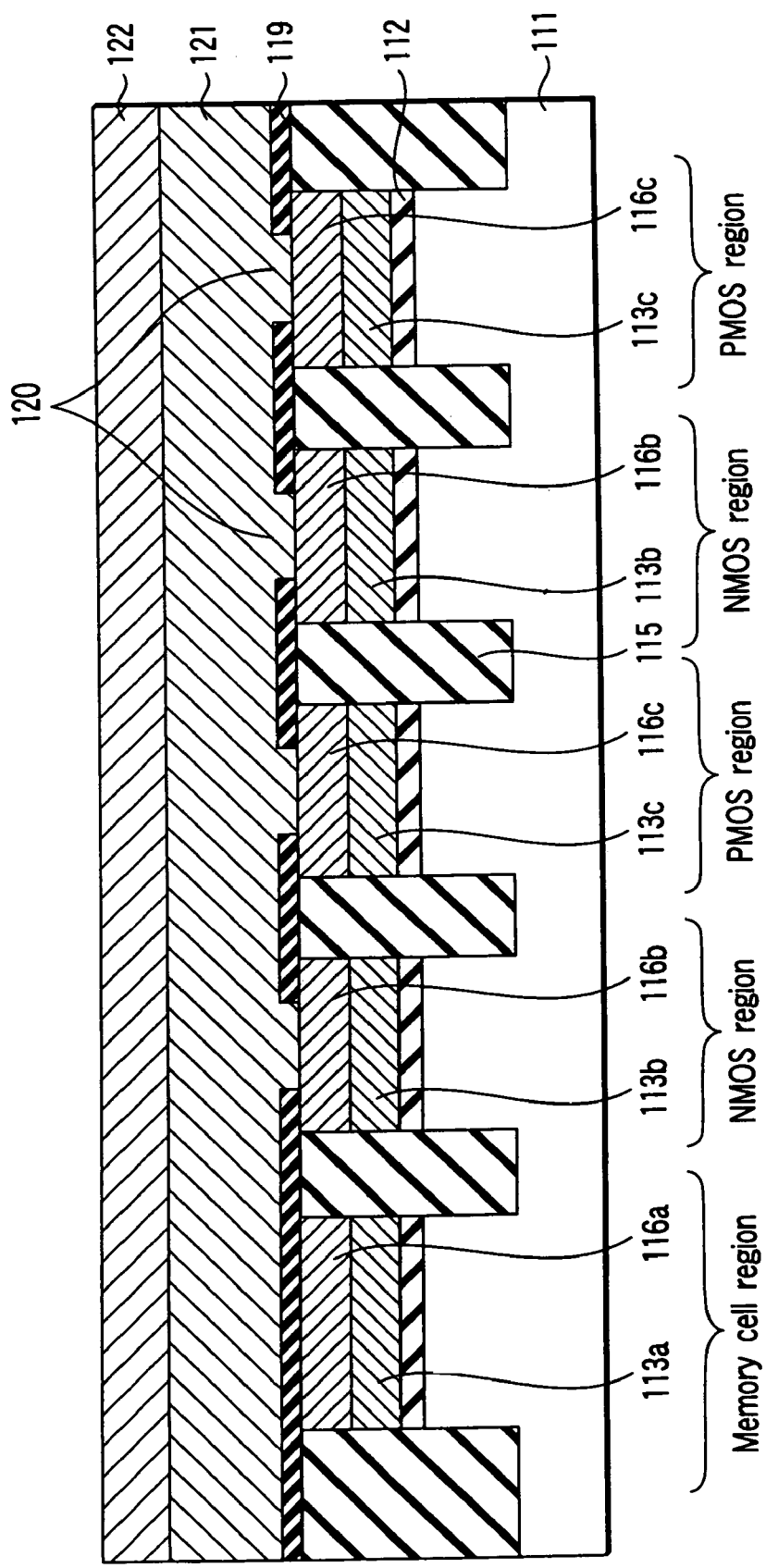

In the next step, a third insulating material layer 121 is deposited to cover the third insulating film 119 and the second conductive layers 116b, 116c, as shown in FIG. 51. It should be noted that the third insulating material layer 121 is formed of polysilicon having an N-type impurity implanted thereinto. Then, a metal film 122 consisting of, for example, tungsten silicide (WSi) is formed on the third electrode material layer 121.

In the next step, the metal film 122 and the third electrode material layer 121 are selectively removed, as shown in FIGS. 42 and 43, thereby forming the gate patterns of the memory transistor 123 and the peripheral transistors 124, 125.

Figure 52:
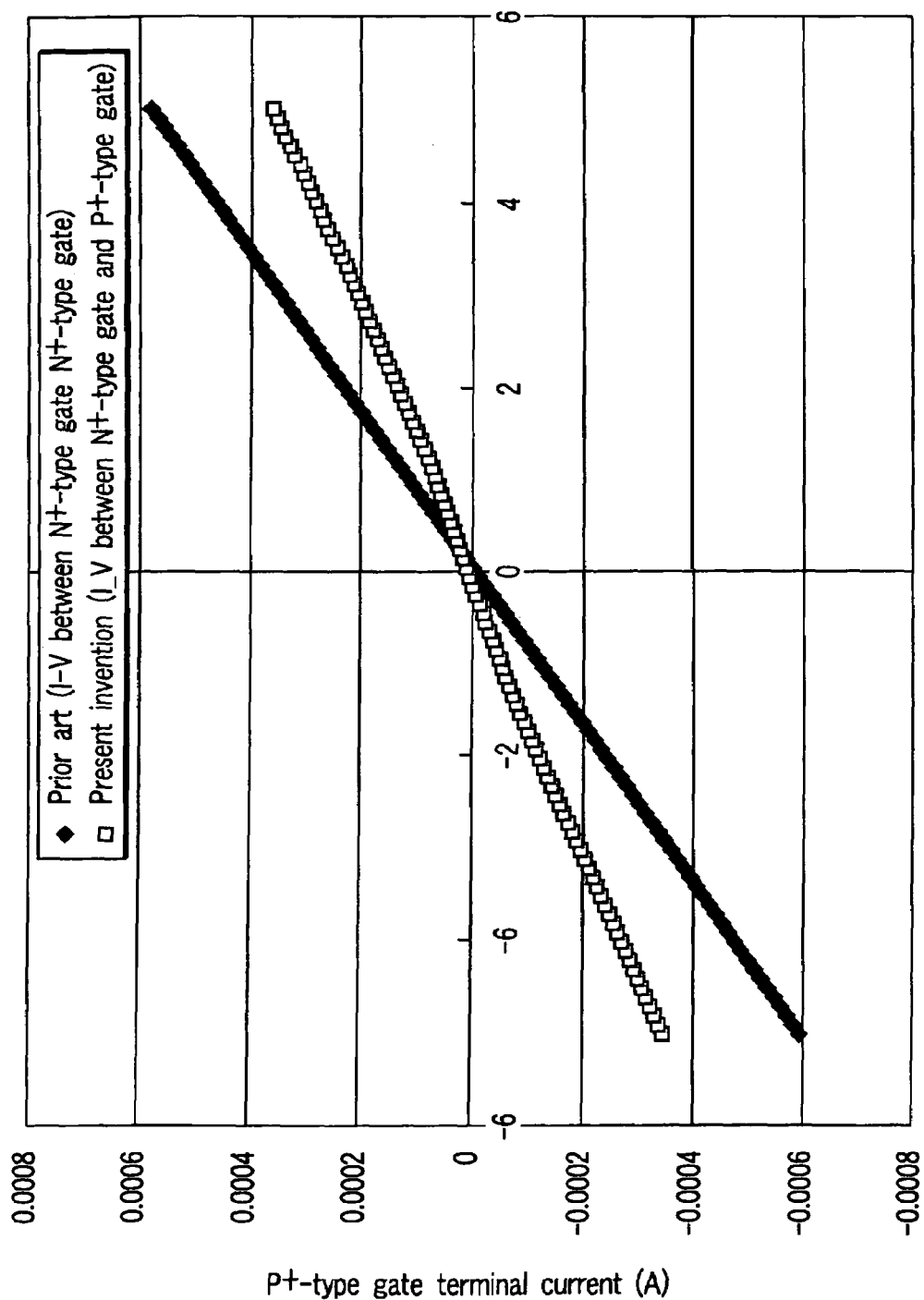
FIG. 52 is a graph showing the I-V characteristics of the semiconductor memory device according to the sixth embodiment of the present invention.

FIG. 52 is a graph showing the I-V characteristics of the semiconductor memory device according to the sixth embodiment of the present invention in comparison with the prior art. In the graph of FIG. 52, the I-V characteristics between the $P^+$-gate consisting of the first and second conductive layers 113c, 116c in the PMOS transistor 125 and the $N^+$-type gate consisting of the third conductive layer 121c in the PMOS transistor 125 are evaluated. As a result, substantially linear I-V characteristics, which is satisfactory, like the prior art, were obtained as shown in FIG. 52. It follows that, even where the PMOS transistor 125 includes the $P^+$-type gate and the $N^+$-type gate as in the sixth embodiment, a PN junction is not formed so as to perform sufficiently the function of the gate. What should be noted is that, according to the present invention, even a logic circuit having a power source voltage not higher than 1.8 V can be driven directly without internally boosting the CMOS circuit so as to make it possible to lower the power source voltage without increasing the number of circuit elements.

According to the sixth embodiment of the present invention, it is possible to form the gate of the NMOS transistor 124 and the gate of the PMOS transistor 125 by using the third electrode material layers 121 of the same conductivity type. In other words, it is unnecessary to implant different impurities by using the light exposure technology for forming the gate of the NMOS transistor 124 and the gate of the PMOS transistor 125. It follows that a CMOS transistor of the dual word function gate can be manufactured easily.

Further, it is also possible to use the third electrode material layers 121 of the NMOS and PMOS transistor 124, 125 as a control gate of the memory transistor 123 without implanting different impurities so as to further facilitate the manufacturing process of the semiconductor memory device.

Also, it is possible to form the third conductive layer 121b of the NMOS transistor 124 contiguous to the third conductive layer 121c of the PMOS transistor 125 on the element separating insulating film 115. As a result, it is unnecessary for the third conductive layer 121b and the third conductive layer 121c to be positioned apart from each other so as to make it possible to decrease the area occupied by the peripheral circuit region.

It should also be noted that, in the peripheral transistors 124, 125, the third insulating film 119 having the open portion 120 is formed between the second conductive layer 116b and the third conductive layer 121b and between the second conductive layer 116c and the third conductive layer 121c. Therefore, the edge portion of the gate electrode is of a three-layer structure including the second conductive layer 116b, the third conductive layer 121b and the third insulating film 119 interposed between the second and third conductive layers 116b and 121b, or of a three-layer structure including the second conductive layer 116c, the third conductive layer 121c and the third insulating film 119 interposed between the second and third conductive layers 116c and 121c. On the other hand, in the memory transistor 123, the gate electrode is of a three-layer structure including the second conductive layer 116a, the third conductive layer 121a, and the third insulating film 119 interposed between the second and third conductive layers 116a and 121a over the entire regions of the second and third conductive layers 116a and 121a. It follows that, concerning the edge portion of the gate electrode to which is applied the gate processing, the gates of the peripheral transistors 124, 125 and the memory transistor 123 have the same laminate structure. It follows that the gate processing can be performed simultaneously without changing the etching conditions for the memory transistor 123 and the peripheral transistors 124, 125.

It should also be noted that the first electrode material layer 113 can be separated in a self-aligned fashion in forming the element separating region as shown in FIG. 45. It follows that the minimum cell size that can be defined by the minimum size can be realized so as to make it possible to miniaturize the cell size.

As described above, the present invention is highly effective for a system LSI (logic embedded memory) having a nonvolatile memory and a logic device of high performance peripheral circuit elements mounted together.

Seventh Embodiment

The seventh embodiment of the present invention is directed to an example that, in forming the PMOS transistor including a P-type first conductive layer and an N-type second conductive layer, an electrode material having an impurity introduced therein is used for forming the first conductive layer. Incidentally, the semiconductor memory device according to the seventh embodiment is equal in the final construction to the semiconductor memory device according to the sixth embodiment. Therefore, the description on the construction of the semiconductor memory device is omitted.

FIGS. 53 to 57 are cross sectional views collectively showing the manufacturing process of the semiconductor memory device according to the seventh embodiment of the present invention. The manufacturing process of the semiconductor memory device according to the seventh embodiment will now be described with reference to FIGS. 53 to 57. Incidentally, in describing the manufacturing process of the semiconductor memory device according to the seventh embodiment, the process steps equal to those of the manufacturing process of the semiconductor memory device according to the sixth embodiment will be described briefly, and the differing process steps alone will be described in detail.

Figure 53:
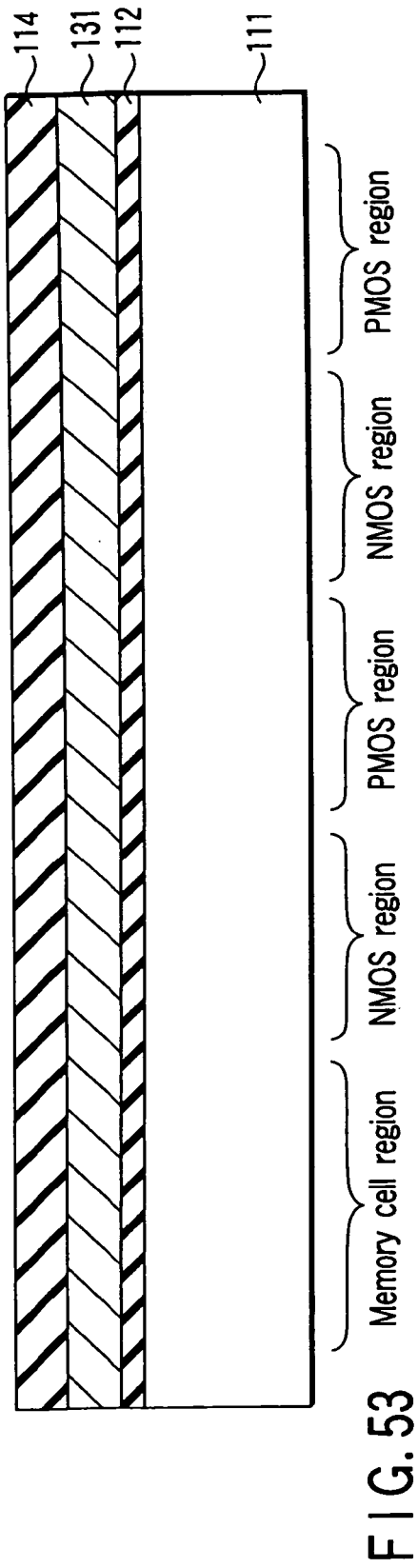
FIGS. 53, 54, 55, 56 and 57 are cross sectional views collectively showing the manufacturing process of a semiconductor memory device according to a seventh embodiment of the present invention.

In the first step, a first insulating film 112 forming a gate insulating film is formed on a semiconductor substrate 111, followed by forming a first electrode material layer 131 on the first insulating film 112, as shown in FIG. 53. The first electrode material layer 131 is formed of polysilicon having an N-type impurity such as phosphorus (P) or arsenic (As) introduced therein. Then, a second insulating film 114 consisting of, for example, a silicon nitride film is deposited on the first electrode material layer 131.

Figure 54:
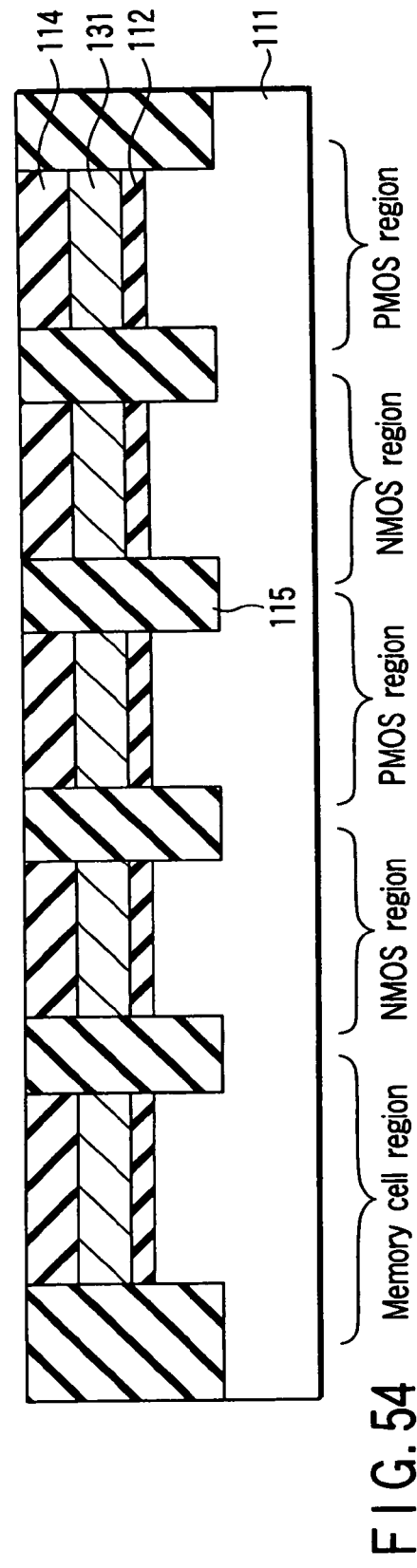

In the next step, the second insulating film 114, the first electrode material layer 131, the first insulating film 112 and the semiconductor substrate 111 are selectively removed so as to form grooves for the element separation, as shown in FIG. 54. Then, an element separating insulating film 115 consisting of, for example, an oxide film is formed to fill the grooves for the element separation, followed by planarizing the element separating insulating film 115 until the surface of the second insulating film 114 is exposed to the outside, thereby forming an element separating region of an STI structure consisting of the element separating insulating film 115. Further, the second insulating film 114 is peeled off.

Figure 55:
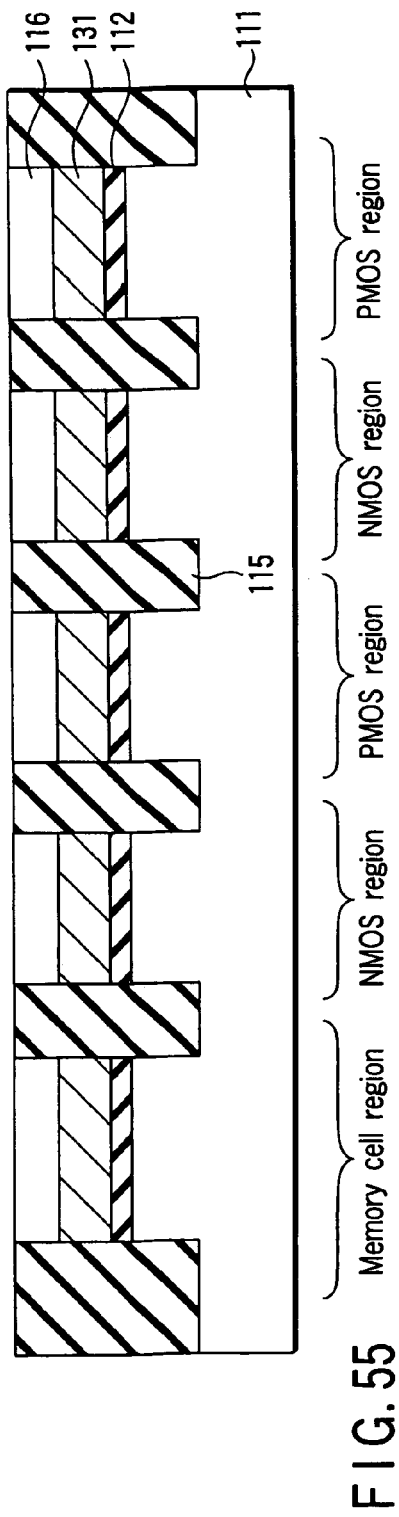

After the peeling of the second insulating film 114, a second electrode material layer 116 consisting of polysilicon into which an impurity is not introduced is formed to cover the first electrode material layer 131 and the element separating insulating film 115, as shown in FIG. 55, followed by removing the second electrode material layer 116 until the surface of the element separating insulating film 115 is exposed to the outside.

Figure 56:
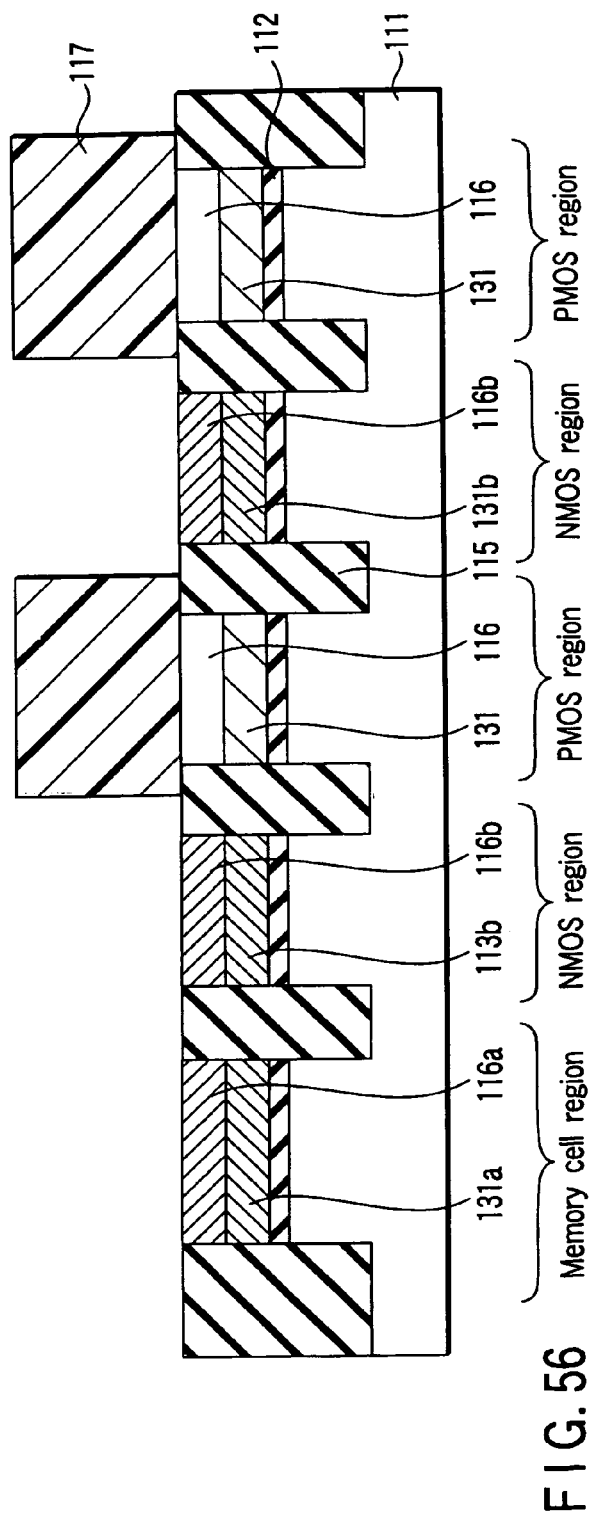

In the next step, a resist layer 117 is formed to cover the second electrode material layer 116 and the element separating insulating film 115, followed by patterning the resist layer 117 such that the resist layer 117 is left unremoved on the PMOS region alone, as shown in FIG. 56. Then, annealing is applied by using the patterned resist layer 117 as a mask, thereby allowing the impurity contained in the first electrode material layer 131 to be diffused into the second electrode material layer so as to form $N^+$-type first conductive layers 131a, 131b and second conductive layers 116a, 116b. Further, the patterned resist layer 117 is removed.

Figure 57:
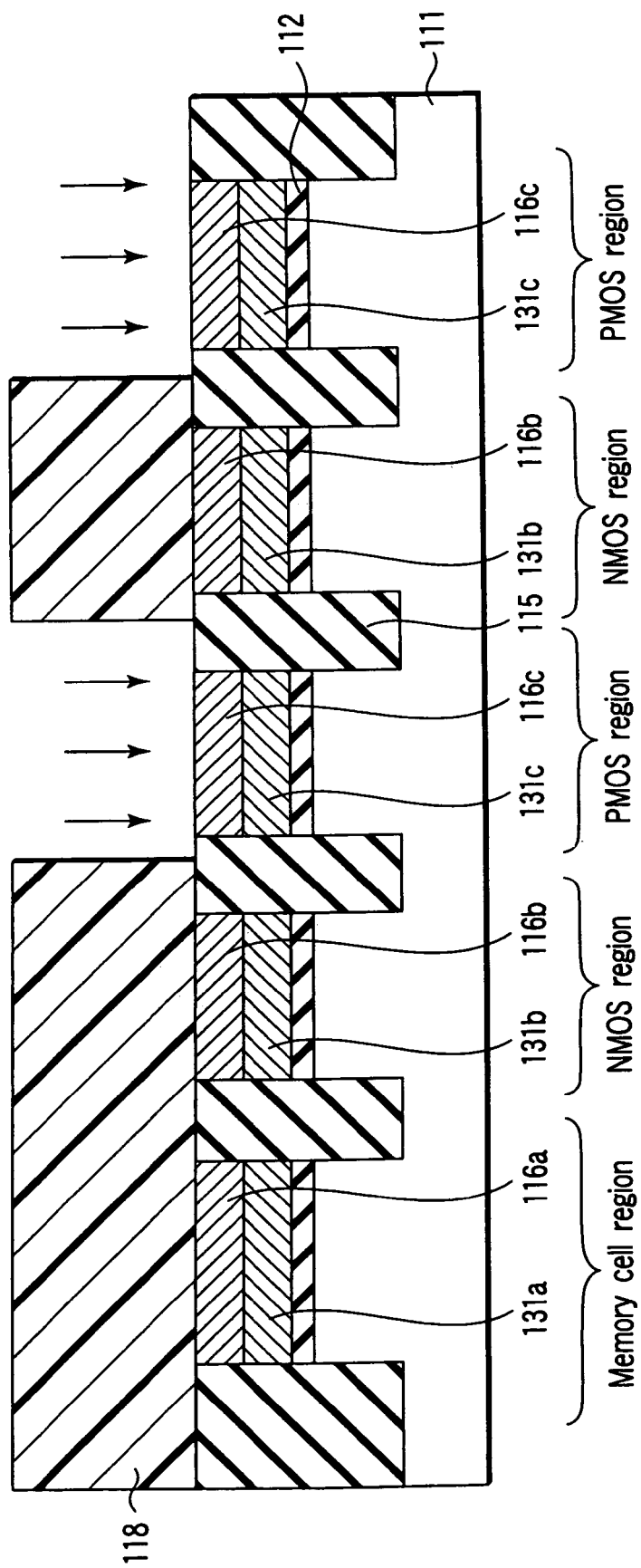
Figures 64A, 64B:
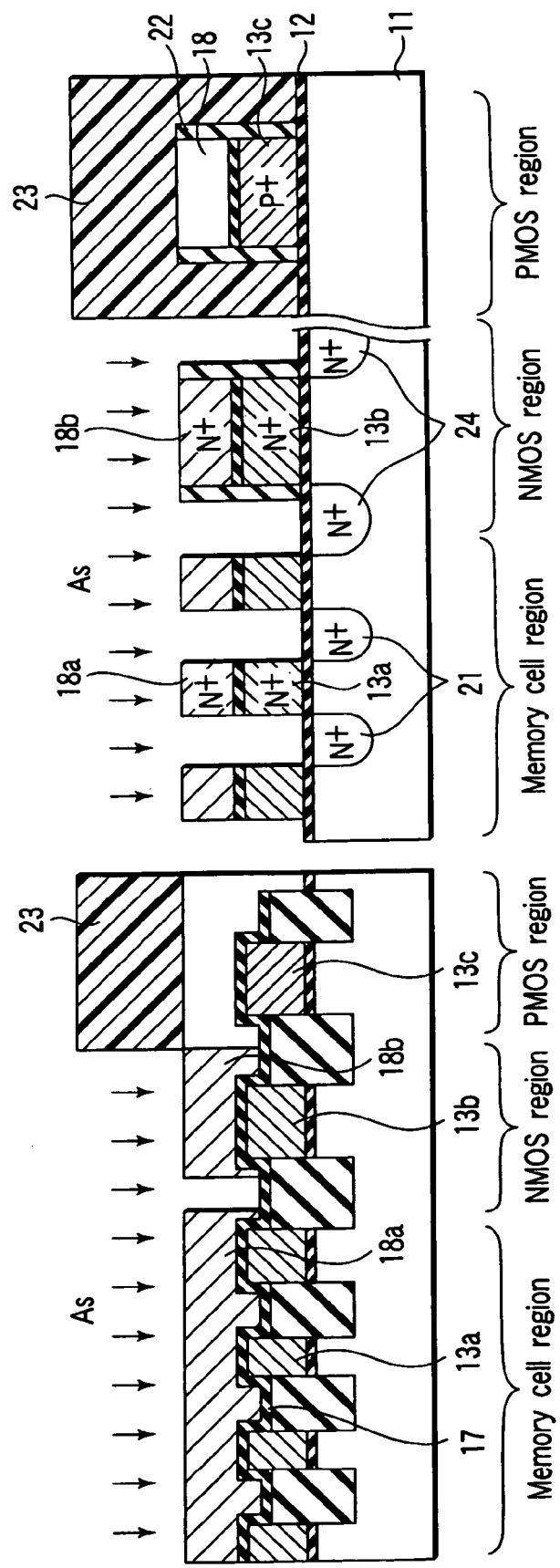
Figures 65A, 65B:
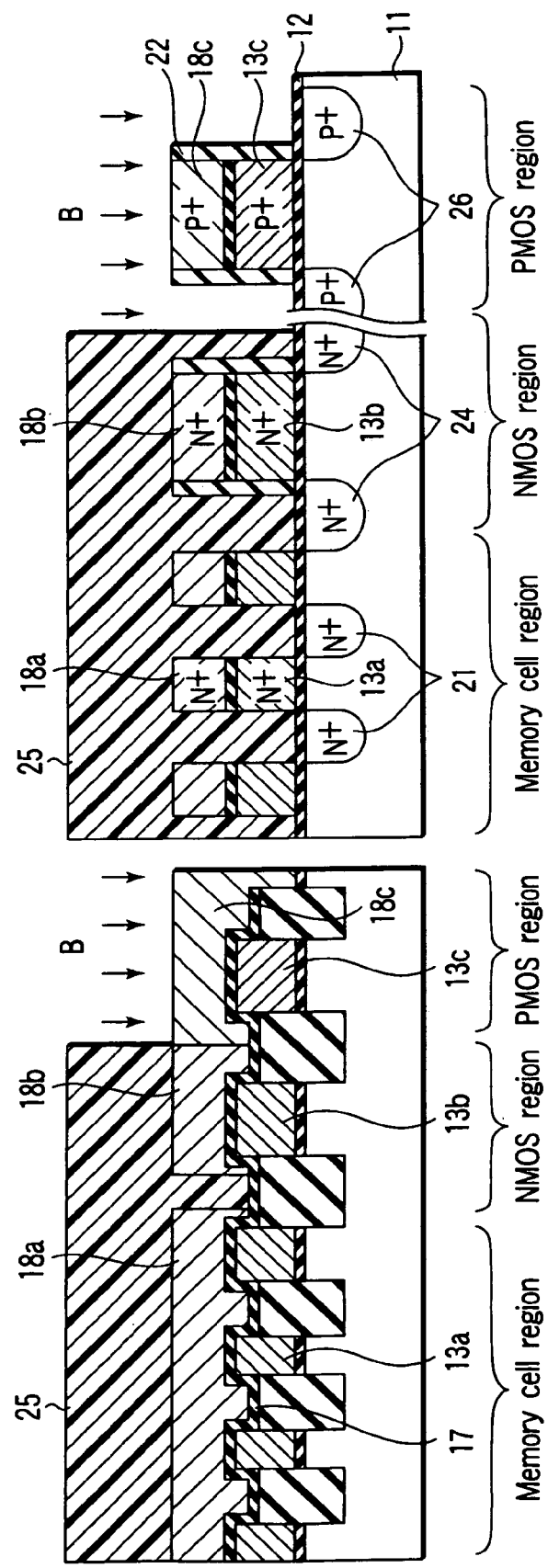
Figures 66A, 66B:
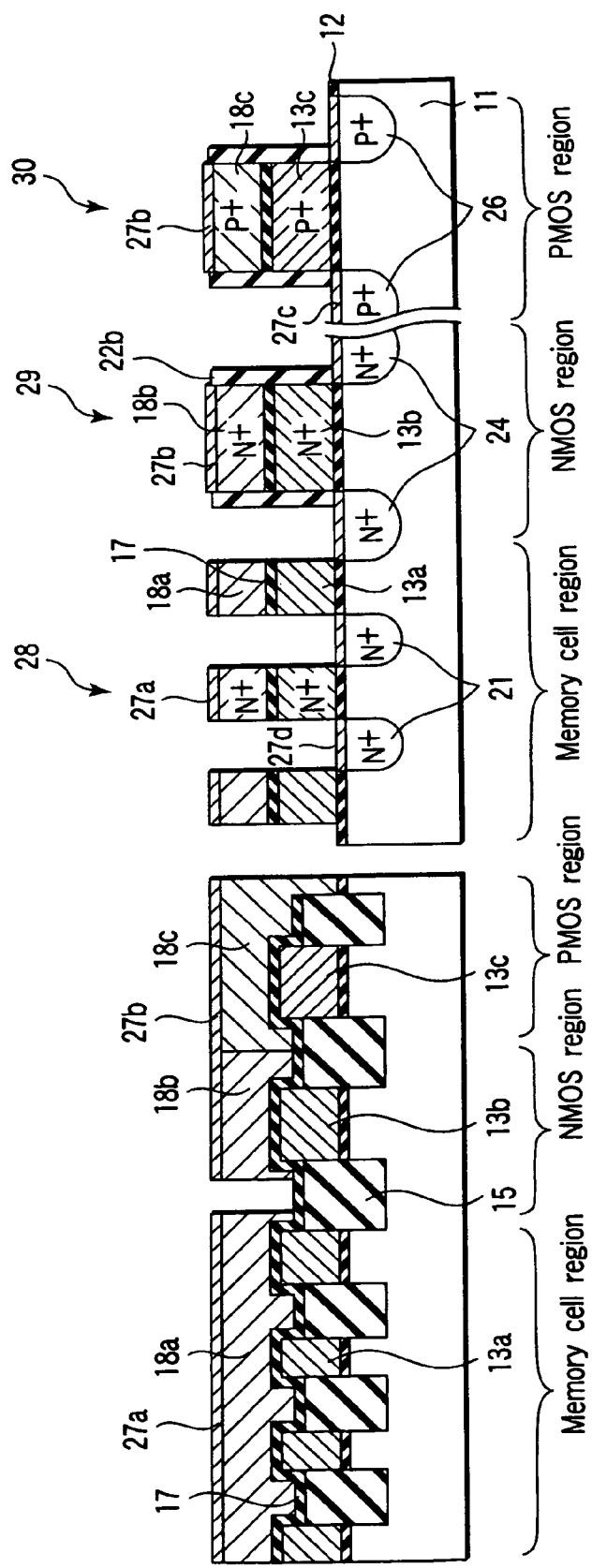

After removal of the patterned resist layer 117, a resist layer 118 is formed to cover the second conductive layers 116a, 116b and the element separating insulating film 115, followed by patterning the resist layer 118 such that the resist layer 118 is left unremoved on the memory cell region and the NMOS region, as shown in FIG. 57. Then, ion implantation is applied to the second electrode material layer 116 in the PMOS region by using the patterned resist layer 118 as a mask. The ion implantation is performed by using, for example, boron (B) as a P-type impurity. Further, annealing is applied so as to permit the impurity implanted into the second electrode material layer 116 to be diffused into the first electrode material layer 131, thereby forming $P^+$-type first conductive layer 131c and second conductive layer 116c. Then, the patterned resist layer 118 is removed.

Further, the process steps shown in FIGS. 48 to 51 are applied as in the sixth embodiment so as to obtain a semiconductor memory device constructed as shown in FIGS. 42 and 43.

According to the seventh embodiment of the present invention described above, it is possible to obtain effects similar to those obtained in the sixth embodiment. Further, it is possible to omit the step of implanting an impurity into the first electrode material layers 113 in the memory cell region and the MOS region.

Incidentally, it is possible to use polysilicon into which an impurity is not implanted for forming the first electrode material layer 131 and to use polysilicon having an impurity implanted thereinto for forming the second electrode material layer 116. In this case, annealing is applied so as to diffuse the impurity contained in the second electrode material layer 116 into the first electrode material layer 131, thereby forming the first and second conductive layers 131a, 131b, 131c, 116a, 116b and 116c.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor memory device comprising:
    forming a first insulating film on a semiconductor substrate having a memory cell region of a NAND type flash memory and a peripheral circuit region;
    forming a first electrode material layer on the first insulating film;
    forming an element separating region in the first electrode material layer, the first insulating film and the semiconductor substrate, the element separating region being formed of an element separating insulating film;
    forming a second insulating film on the first electrode material layer in the memory cell region;
    forming a second electrode material layer on the second insulating film and the first electrode material layer;
    selectively removing the first and second electrode material layers and the second insulating film to form first gate electrodes having first and second conductive layers in the memory cell region and second gate electrodes having third and fourth conductive layers in the peripheral circuit region, the first and third conductive layers being formed of the first electrode material layer, and the second and fourth conductive layers being formed of the second electrode material layer;

forming first diffusion layers between the first gate electrodes in the semiconductor substrate, each of the first diffusion layers being common to the first gate electrodes adjacent thereto;

forming third insulating films on the first diffusion layers and fourth insulating films on side surfaces of the second gate electrodes, the first diffusion layers being covered with the third insulating films, the third insulating film completely filling a clearance between the first gate electrodes;

forming second diffusion layers between the second gate electrodes in the semiconductor substrate;

removing the first insulating film on the second diffusion layers and a boundary region between the memory cell region and the peripheral circuit region to separate the first insulating film in the memory cell region from the first insulating film in the peripheral circuit region in a direction of a channel length, the first insulating film in the memory cell region continuing in the direction of the channel length, and the first insulating film in the peripheral circuit region being divided where each of the second gate electrodes is formed in the direction of the channel length; and forming first, second and third silicide films only on the second conductive layer, the fourth conductive layer and the second diffusion layers, respectively.

2. The method of manufacturing a semiconductor memory device according to claim 1, wherein a thickness A1 of each of the third insulating films as formed satisfies a relationship $X/2 \leq A1 < Y/2$, and a thickness A2 of each of the fourth insulating films as formed satisfies a relationship $X/2 \leq A2 < Y/2$, where X represents a first distance between the first gate electrodes, and Y represents a second distance between the second gate electrodes.

3. The method of manufacturing a semiconductor memory device according to claim 1, wherein a second distance between the second gate electrodes is 1.3 to 5.0 times as long as a first distance between the first gate electrodes.

4. The method of manufacturing a semiconductor memory device according to claim 1, wherein the third insulating films are formed of a silicon oxide film, a TEOS film, an ozone TEOS film, an HTO film, an SOG film, a coating type oxide film, an SA-CVD film, a plasma CVD film or a PSG film.

5. The method of manufacturing a semiconductor memory device according to claim 1, wherein a surface of the element separating insulating film is positioned lower than a surface of the first electrode material layer by partly removing the element separating insulating film after formation of the element separating region.

6. The method of manufacturing a semiconductor memory device according to claim 1, further comprising:
    forming a fifth insulating film between the third and fourth conductive layers; and
    forming an open portion in the fifth insulating film.

7. The method of manufacturing a semiconductor memory device according to claim 6, wherein the open portion is positioned in a center between the third and fourth conductive layers.

8. The method of manufacturing a semiconductor memory device according to claim 6, wherein a plurality of the open portions are formed between the third and fourth conductive layers.

* * * * *